United States Patent
Kawano et al.

(10) Patent No.: US 8,178,941 B2
(45) Date of Patent: May 15, 2012

(54) SEMICONDUCTOR DEVICE

(75) Inventors: Ryouichi Kawano, Matsumoto (JP);
Tomoyuki Yamazaki, Matsumoto (JP);
Michio Nemoto, Nagano (JP); Mituhiro Kakefu, Matsumoto (JP)

(73) Assignee: Fuji Electric Co., Ltd., Kawasaki (JP)

( * ) Notice: Subject to any disclaimer, the term of this patent is extended or adjusted under 35 U.S.C. 154(b) by 205 days.

(21) Appl. No.: 12/507,735

(22) Filed: Jul. 22, 2009

(65) Prior Publication Data

US 2010/0019342 A1      Jan. 28, 2010

(30) Foreign Application Priority Data

Jul. 22, 2008   (JP) ................................ 2008-188613

(51) Int. Cl.
*H01L 23/58* (2006.01)

(52) U.S. Cl. .......................... 257/494; 257/495; 257/502
(58) Field of Classification Search .................. 257/494, 257/495, 502
See application file for complete search history.

(56) References Cited

FOREIGN PATENT DOCUMENTS

| JP | 08-306937 A | 11/1996 |
| JP | 09-232597 A | 9/1997 |
| JP | 2000-183366 A | 6/2000 |
| JP | 2005-340528 A | 12/2005 |
| JP | 2007-266123 A | 10/2007 |

*Primary Examiner* — Samuel Gebremariam
(74) *Attorney, Agent, or Firm* — Rabin & Berdo, P.C.

(57) ABSTRACT

In a semiconductor device having a pn-junction diode structure that includes anode diffusion region including edge area, anode electrode on anode diffusion region, and insulator film on edge area of anode diffusion region, the area of anode electrode above anode diffusion region with insulator film interposed between anode electrode and anode diffusion region is narrower than the area of insulator film on edge area of anode diffusion region.

12 Claims, 21 Drawing Sheets

SEMICONDUCTOR DEVICE

CROSS-REFERENCE TO RELATED APPLICATION

This application claims foreign priority benefits under 35 USC §119 of Japanese patent application serial number JP-PA-2008-188613, the entire disclosure of which is incorporated herein by reference.

FIELD OF THE INVENTION

The invention relates to power semiconductor devices mounted on power modules and such modules. Specifically, the invention relates to semiconductor devices having a junction diode structure that is required to exhibit a high reverse recovery withstand.

BACKGROUND

To meet the recent demands for saving energy, power modules employable for power converters have been increasing the fields of application thereof. A conventional power converter module structure is shown in FIG. 17. The power converter module shown in FIG. 17 includes converter section 100, brake section 200, and inverter section 300. In inverter section 300, insulated gate bipolar transistor (hereinafter referred to as "IGBT") 301 and a free wheeling diode (hereinafter referred to as "FWD") 302 are connected in opposite parallel to each other. Usually, FWD 302 used in inverter section 300 conducts a reverse recovery mode of operation, through which FWD 302 recovers a reverse voltage blocking state from a forward current conduction state. Since FWD 302 is liable to cause breakdown during its reverse recovery mode of operation, it is required for FWD 302 to exhibit a certain reverse recovery withstand so that the device will hardly ever break down.

Now the process of breakdown caused during the reverse recovery mode of operation will be described below in connection with the behaviors of the internal carries and with reference to FIG. 18. FIG. 18 is a cross-sectional view of a semiconductor substrate in a conventional FWD. The conventional FWD has a general structure that employs n-type silicon semiconductor substrate (hereinafter referred to as "n-type substrate") 1. In the first major surface portion of n-type substrate 1, p-type anode diffusion region 2 is formed. Anode electrode 3, made of an Al—Si alloy or like alloy, is made to be in ohmic contact with p-type anode diffusion region 2. On the back surface of n-type substrate 1, $n^+$-type diffusion layer 4, the surface impurity concentration thereof is high enough to realize an ohmic contact, is formed. Cathode electrode 5 formed of a metal film laminate including a Ti film, a Ni film, and a Au film is formed on $n^+$-type diffusion layer 4.

In the peripheral surface portion on the anode side of the FWD, edge termination region 6 is formed. Edge termination region 6 has an electric field relaxation structure such as guard ring structure 6-1, a field plate structure and a RESURF structure that facilitates securing the breakdown voltage of the FWD. Since a main current flows through p-type anode diffusion region 2 on the inner side of edge termination region 6, the region including p-type anode diffusion region 2 is called "active region 7". In the following descriptions, the boundary between edge termination region 6 and active region 7 is set on outer edge 12 of p-type anode diffusion region 2.

The load of the power module that mounts the FWD's having the structure described above is the inductance that is typically a motor. As described in FIG. 17, a reflux current flows also through the FWD's in response to the ON and OFF of the IGBT's. Initially, the FWD is in the blocking state, in which the FWD is biased reversely. When a reflux current flows, the FWD having the structure described above is biased forward.

Referring again to FIG. 18, as the hole potential in p-type anode diffusion region 2 in the FWD biased forward exceeds the diffusion potential of the pn-junction (internal potential), holes are injected from p-type anode diffusion region 2 to $n^-$-type layer (the same with the n-type substrate) 1 as minority carriers. As a result, conductivity modulation occurs corresponding to the concentration of hole carriers injected heavily to $n^-$-type layer 1 and the concentration of electron carriers (majority carriers) increases. Therefore, the FWD exhibits a forward characteristic, in which the resistance reduces greatly and the forward current increases rapidly as the well-known forward I-V curve of a diode indicates.

Then, as the FWD is biased in reverse, the excess minority carriers (holes) and majority carriers (electrons) caused by the conductivity modulation and remaining in $n^-$-type layer 1 are recombined with each other or ejected, making a depletion layer expand in $n^-$-type layer 1. As the depletion layer expands to the utmost thereof, the FWD is in a voltage blocking state. This process is called the "reverse recovery". The carrier ejection process described above and caused during the reverse recovery is called the "reverse recovery current" macroscopically. Although the FWD is biased reversely, a transient current flows during the reverse recovery. As the reduction rate of the reverse recovery current in shifting from the forward flow to the reverse flow is higher, the peak value of the reverse recovery current is larger. (The phenomenon is called the "hard recovery".)

The reverse recovery current, the peak value thereof is large, is caused when the minority carriers (holes) are extracted (or swept out) from the anode electrode that is on the negative side, when the FWD is biased reversely. The reverse recovery current, the peak value thereof is large and that is caused as described above, localizes to curved portion 13 in the edge area of the p-type anode diffusion region, thereto the reverse bias electric field is liable to localize. It is well known that the reverse recovery current that behaves as described above causes a high current density in curved portion 13, further causing the breakdown of the FWD (especially when the reduction rate of the reverse recovery current in shifting from the forward flow to the reverse flow is large). The phenomena described above is caused, since the edge area of the p-type anode diffusion region has a certain curvature and, therefore, the equipotential curve density therein is liable to be dense. The phenomenon described above is caused, also since the minority carriers, distributing below edge termination region 6 formed in the surface portion of a peripheral region surrounding the p-type anode diffusion region, through which the main current of the general FWD flows, are extracted (swept out) intensively through the curved portion.

Japanese Patent Publication No. 3444081 describes a structure for relaxing the minority carrier extraction from the curved portion in the edge area of the anode diffusion region and further for lowering the reverse recovery current peak. The structure described in the Japanese Patent Publication No. 3444081 includes an anode electrode formed above the edge area of the anode diffusion region with an insulator film interposed between the edge area of the p-type anode diffusion region and the anode electrode. (In other words, the effective anode electrode area in contact with the p-type anode diffusion region is withdrawn from the edge area of the anode diffusion region.) And, the length of the insulator film sandwiched between the anode electrode and the edge area of the p-type anode diffusion region (that is the withdrawal length of the effective anode electrode area) is set to be longer than the minority carrier diffusion length.

Japanese Unexamined Patent Application Publication No. 2005-340528, discloses a structure that shortens the carrier lifetime locally so as not to make the currents localize to edge area 8 of p-type anode diffusion region 2.

The magnitude of the reverse recovery current is larger as the amount of the accumulated excess minority carriers on the collector side of n⁻-type layer 1 is larger. As the reverse recovery current is higher, a hard recovery waveform is more liable to be caused. As the hard recovery waveform of the reverse recovery current is caused, a higher initial reverse voltage is caused. As a too-high initial reverse voltage is caused, the initial reverse voltage exceeds the rated reverse voltage of the FWD to the higher side, breaking down the FWD.

Japanese Unexamined Patent Application Publication No. Hei. 8 (1996) 306937, and Japanese Unexamined Patent Application Publication No. Hei. 8 (1996) 306937, describe a cross-sectional view showing the edge area structure of an anode electrode. The cross-sectional view shows anode electrode 3 laminated above edge area 8 of p-type anode diffusion region 2 with insulator 9 interposed between anode electrode 3 and edge area 8.

However, in the diode (FWD) described in the Japanese Patent Publication No. 3444081, a potential difference is caused in the reverse recovery thereof between edge area 8 of p-type anode diffusion region 2 and the inner area of p-type anode diffusion region 2 in contact with anode electrode 3. If through-holes are caused by some kinds of defects in insulator 9 or if insulator 9 is thin locally, the surface of edge area 8 in p-type anode diffusion region 2 and the portion of anode electrode 3 above edge area 8 of p-type anode diffusion region 2 with insulator 9 interposed between anode electrode 3 and edge area 8 will be short-circuited with each other sometimes by insulation breakdown. Since the minority carriers distributing in the outer margin (edge termination region 6) of the diode localize to the short-circuited portion, the effects of relaxing the reverse recovery current peak described in Japanese Patent Publication No. 3444081 are not obtained so well as expected and the device will be broken down with a high possibility. The previously mentioned kinds of defects that cause holes in insulator film 9 occur due to foreign materials and damage caused during the wafer process. Usually, it is extremely difficult to form insulator film 9 that does not include any of the defects described above.

In view of the foregoing, it is desirable to obviate the problems described above. It would be also desirable to provide a semiconductor device, that is a pn-junction diode having a structure, in which an anode electrode is formed above the edge area of a p-type anode diffusion region and that stably exhibits a high reverse recovery withstand independently of the existence and nonexistence of the defects caused during the wafer process for manufacturing the semiconductor device.

SUMMARY OF THE INVENTION

According to the subject matter of a first aspect of the invention, a semiconductor device includes a semiconductor substrate of a first conductivity type, an anode diffusion region of a second conductivity type in the surface portion on the first major surface side of the semiconductor substrate, an edge termination region surrounding the anode diffusion region in the surface portion on the first major surface side of the semiconductor substrate, an anode electrode on the anode diffusion region, the anode electrode including a first area in ohmic contact with the anode diffusion region, the anode electrode including a second area above the edge area of the anode diffusion region with an insulator film interposed between the second area of the anode electrode and the edge area of the anode diffusion region, the second area of the anode electrode being above the surface of the edge area of the anode diffusion region between the outer edge of the first area of the anode electrode and the outer edge of the anode diffusion region, and the area of the second area of the anode electrode being smaller than the area of the insulator film on the surface of the edge area of the anode diffusion region. According to the subject matter of a second aspect of the invention, the second area of the anode electrode is extended outward the outer edge of the anode diffusion region.

According to the subject matter of a third aspect of the invention, the length of the second area of the anode electrode in the direction perpendicular to the outer edge of the anode diffusion region is equal to or smaller than half the length of the insulator film in the direction perpendicular to the outer edge of the anode diffusion region. According to the subject matter of a fourth aspect of the invention, the outer edge of the anode electrode is positioned on or outside the inner edge of the insulator film on the edge area of the anode diffusion region, the semiconductor device further includes a ring-shaped first metal film on the insulator film outside the outer edge of the anode electrode, the ring-shaped first metal film is in contact with the surface of the edge area of the anode diffusion region via a ring-shaped opening formed through the insulator film, and the first metal film has an outer edge positioned outside the outer edge of the anode diffusion region. According to the subject matter of a fifth aspect of the invention, the semiconductor device further includes a ring-shaped second metal film formed above the edge area of the anode diffusion region with the insulator film interposed between the second metal film and the edge area of the anode diffusion region, and the second metal film is isolated electrically form the anode electrode.

According to the subject matter of a sixth aspect of the invention, the semiconductor device in accordance with the above mentioned fourth aspect further includes a ring-shaped second metal film formed above the edge area of the anode diffusion region with the insulator film interposed between the second metal film and the edge area of the anode diffusion region; the second metal film is isolated electrically form the anode electrode; and the second metal film is between the first metal film and the outer edge of the anode electrode. According to the subject matter of a seventh aspect of the invention, the outer edge of the anode electrode is positioned on or outside the inner edge of the insulator film on the edge area of the anode diffusion region, a semiconductor device in accordance with the first aspect of the invention described above further includes a ring-shaped third metal film on the insulator film outside the outer edge of the anode electrode, and the ring-shaped third metal film is in contact with the surface of the edge area of the anode diffusion region via a ring-shaped opening formed through the insulator film. According to the subject matter of an eighth aspect of the invention, a semiconductor device in accordance with the above-described fourth aspect of the invention further includes a ring-shaped third metal film formed between the first metal film and the anode electrode.

Moreover, according to the subject matter of a ninth aspect of the invention, a semiconductor device includes a semiconductor substrate of a first conductivity type, an anode diffusion region of a second conductivity type in the surface portion on the first major surface side of the semiconductor substrate, an edge termination region surrounding the anode diffusion region in the surface portion on the first major surface side of the semiconductor substrate, an anode electrode on the anode diffusion region, the anode electrode including a first area in ohmic contact with the anode diffusion region, the anode electrode including a second area above the edge area of the anode diffusion region with an insulator film interposed between the second area of the anode electrode and the edge area of the anode diffusion region, the second area of the anode electrode being above the surface of the edge area of the anode diffusion region between the outer edge of the first area of the anode electrode and the outer edge of the anode diffusion region, and a ring-shaped fourth metal film on the insulator film on the edge area of the anode diffusion region, the fourth metal film being in contact with the edge area of the anode diffusion region via an opening formed through the insulator film, the length of the opening being equal to or larger than half the length of the edge area of the anode diffusion region in the direction perpendicular to the outer edge of the anode diffusion region. According to the semiconductor device described below, the semiconductor device further includes a lifetime control region including the bottom portion of the edge area of the anode diffusion region and the portion of the semiconductor substrate in the vicinity of the bottom portion of the edge area, the lifetime control region extends across the pn-junction between the semiconductor substrate and the anode diffusion region, and the minority carrier lifetime in the lifetime control region is shortened locally.

According to the invention, there is provided a semiconductor device, that is a pn-junction diode having a structure, in which an anode electrode is formed above the edge area of a p-type anode diffusion region and that stably exhibits a high reverse recovery withstand independently of the existence and nonexistence of the defects caused during the wafer process for manufacturing the semiconductor device.

A ring-shaped fourth metal film is formed on the insulator film on the edge area of the anode diffusion region, the fourth metal film being in contact with the edge area of the anode diffusion region, via an opening formed through the insulator film, and being separated from the anode electrode. A ratio of width $W_{FFM}$ of the ring shape of the fourth metal film to a shortest distance $W_{ACT}$ from among distances of lines that extend perpendicularly from the geometrical barycenter of the first major surface side of the p-type anode diffusion region up to respective sides of a polygon defined by an outer edge 24 of the p-type anode diffusion region, is $W_{FFM}/W_{ACT} \leq 0.3$. Bringing the fourth metal film into contact with an anode diffusion region 2 over a wide area has the effect of fixing the electrostatic potential in the vicinity of the fourth metal film over a wide region, and of curtailing increases in the density of current flowing in the active region.

BRIEF DESCRIPTIONS OF THE DRAWINGS

DETAILED DESCRIPTION OF THE PREFERRED EMBODIMENTS

Now the invention will be described in detail hereinafter with reference to the accompanied drawings, which illustrate preferred embodiments of the invention. Although the invention is described below in connection with the preferred embodiments, changes and modifications will be apparent to the persons skilled in the art, without departing from the true spirit of the invention.

Figure 1:
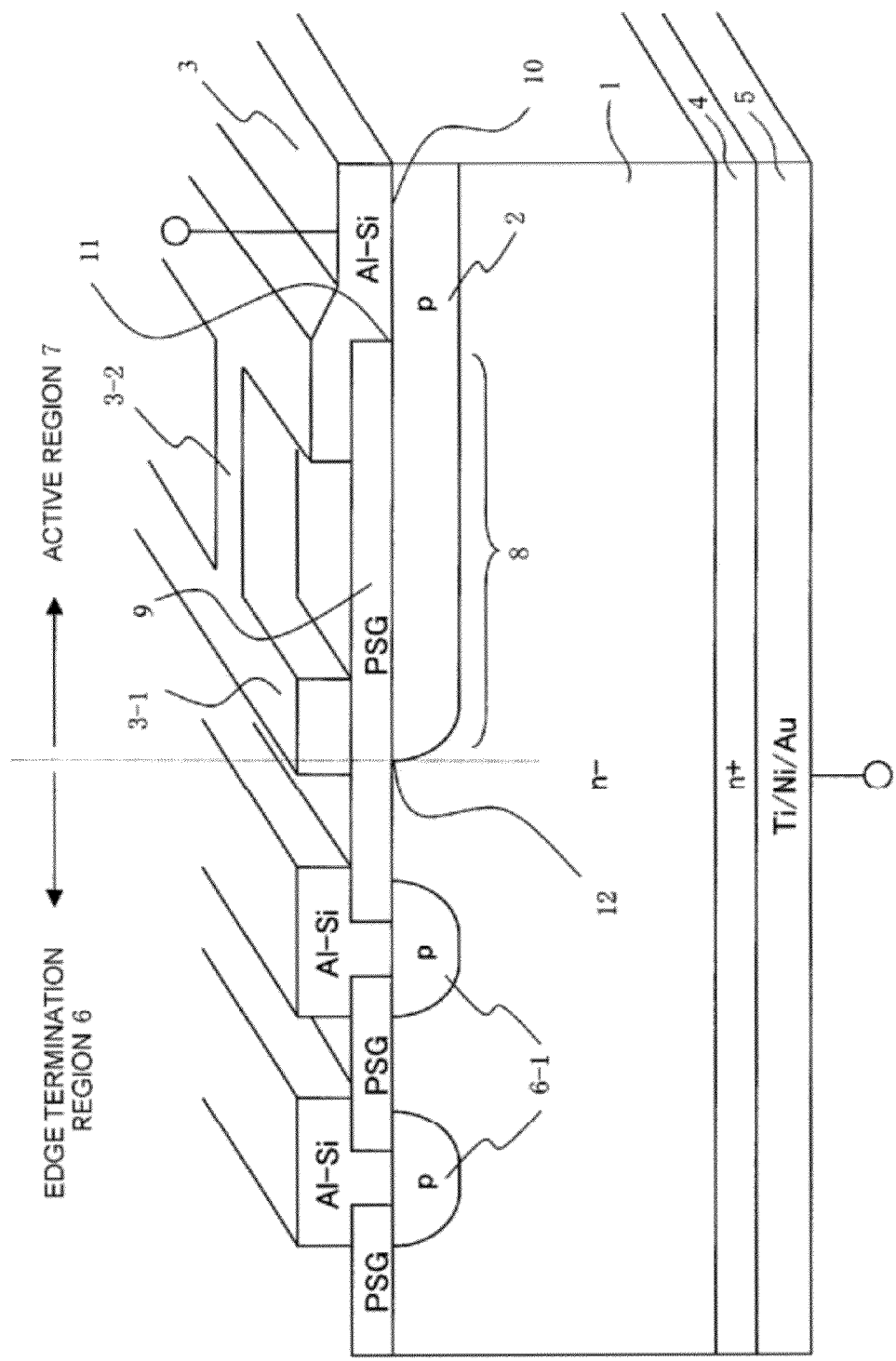
FIG. 1 is an oblique and cross-sectional view of a semiconductor device according to a first embodiment of the invention.

FIG. 1 is an oblique and cross-sectional view of a diode (hereinafter referred to as an "FWD") according to a first embodiment of the invention.

The usual FWD employs n-type substrate 1. In the surface portion on the first major surface side of n-type substrate 1, p-type anode diffusion region 2 is formed. If necessary, guard rings 6-1 are formed in the peripheral region surrounding p-type anode diffusion region 2 through the same process, through which p-type anode diffusion region 2 is formed. The surface portion of p-type anode diffusion region 2 is doped heavily enough to facilitate obtaining an ohmic contact. Anode electrode 3 made of an Al—Si alloy is formed on p-type anode diffusion region 2. (In the following descriptions, anode electrode 3 is made of an Al—Si alloy.) On the back surface of n-type substrate 1, $n^+$-type diffusion layer 4 is formed so that an ohmic contact may be obtained. Then, cathode electrode 5 is formed on n⁺-type diffusion layer 4. A three-layer structure formed of a Ti film, a Ni film, and a Au film is employed usually for cathode electrode 5.

The guard ring structure described above or a field plate structure is arranged on the peripheral surface around anode electrode 3 to secure the breakdown voltage of the FWD. According to the first embodiment, a guard ring structure, which arranges p-type diffusion regions 6-1 formed simultaneously with p-type anode diffusion region 2 in a ring pattern, is employed exemplary. In FIG. 1, the peripheral region including guard rings 6-1 is designated as edge termination region 6.

The area of p-type anode diffusion region 2 positioned outside the ohmic-contact area of anode electrode 3 is defined as edge area 8 of p-type anode diffusion region 2 (hereinafter simply referred to sometimes as "edge area 8"). Anode electrode 3 is arranged above edge area 8 with insulator film 9 interposed between anode electrode 3 and edge area 8 to isolate anode electrode 3 from p-type anode diffusion region 2. By employing the arrangement described above, the current density in edge area 8 of p-type anode diffusion region 2, therein electric field localization is most liable to cause, is reduced and the breakdown of the FWD is prevented from causing.

It is found that the effect of preventing the FWD from breakdown will be impaired due to poor insulation, if defects exist in the phosphosilicate glass (hereinafter referred to as the "PSG") of insulator film 9 on edge area 8 of p-type anode diffusion region 2. For preventing the breakdown prevention effect of the FWD from being impaired, the anode electrode area on the PSG is reduced. By reducing the anode electrode area on the PSG, the provability, at which the FWD is broken down, will be reduced, even if some kinds of defects exist in the PSG. Thus, the FWD is prevented from being broken down according to the subject matters of the invention.

The anode electrode area on the PSG is reduced according to the invention to prevent anode electrode 3 and p-type anode diffusion region 2 from being short-circuited with each other via some defective portions, even if the defective portions are caused in insulator film 9 during some manufacturing steps. Insulator film 9 made, for example, of a PSG is formed usually by chemical vapor deposition (hereinafter referred to as "CVD"). If film deposition is repeated, reaction products will accumulate in the deposition chamber. The accumulated reaction products may move onto the wafer although not very often and remain thereon as particles during the PSG film deposition. The particles may further cause through-holes and other such defects. Especially when the chip size is large, the existence provability of the defects per a chip is large, lowering the throughput of non-defective products. However, since the area of anode electrode 3 above edge area 8 is narrowed according to the invention, the existence provability of the defects in insulator film 9 below anode electrode 3 is reduced and, therefore, the intended electrical characteristics are obtained at a high throughput of non-defective products.

If described more in detail, anode electrode 3 is extended onto the surface of insulator film 9 on edge 12 of p-type anode diffusion region 2 according to the first embodiment and the extended area of anode electrode 3 is made to work for a field plate. Since anode electrode 3 covers insulator film 9 like a sheet usually, anode electrode 3 on insulator film 9 is wider than insulator film 9. For making the area of anode electrode 3 on insulator film 9 to be narrower than insulator film 9 in the arrangement described above, anode electrode 3 is divided into an extended electrode area exhibiting the function of metal field plate 3-1 and an inner electrode area (anode electrode 3). Extended electrode area 3-1 and the inner electrode area 3 are connected with bridging electrode portion 3-2 as shown in FIG. 1. If seen downward, anode electrode 3 has, for example, a wide opening on insulator film 9. Thus, it is possible to make the area of anode electrode 3 on insulator film 9 to be substantially smaller than the area of insulator film 9. The area of anode electrode 3 formed above p-type anode diffusion region 2 with insulator film 9 interposed between anode electrode 3 and p-type anode diffusion region 2 is narrowed substantially. Therefore, the provability of short-circuiting caused by the defects in insulator film 9 beneath anode electrode 3 is reduced, resulting in a high throughput of non-defective products.

Figure 2:
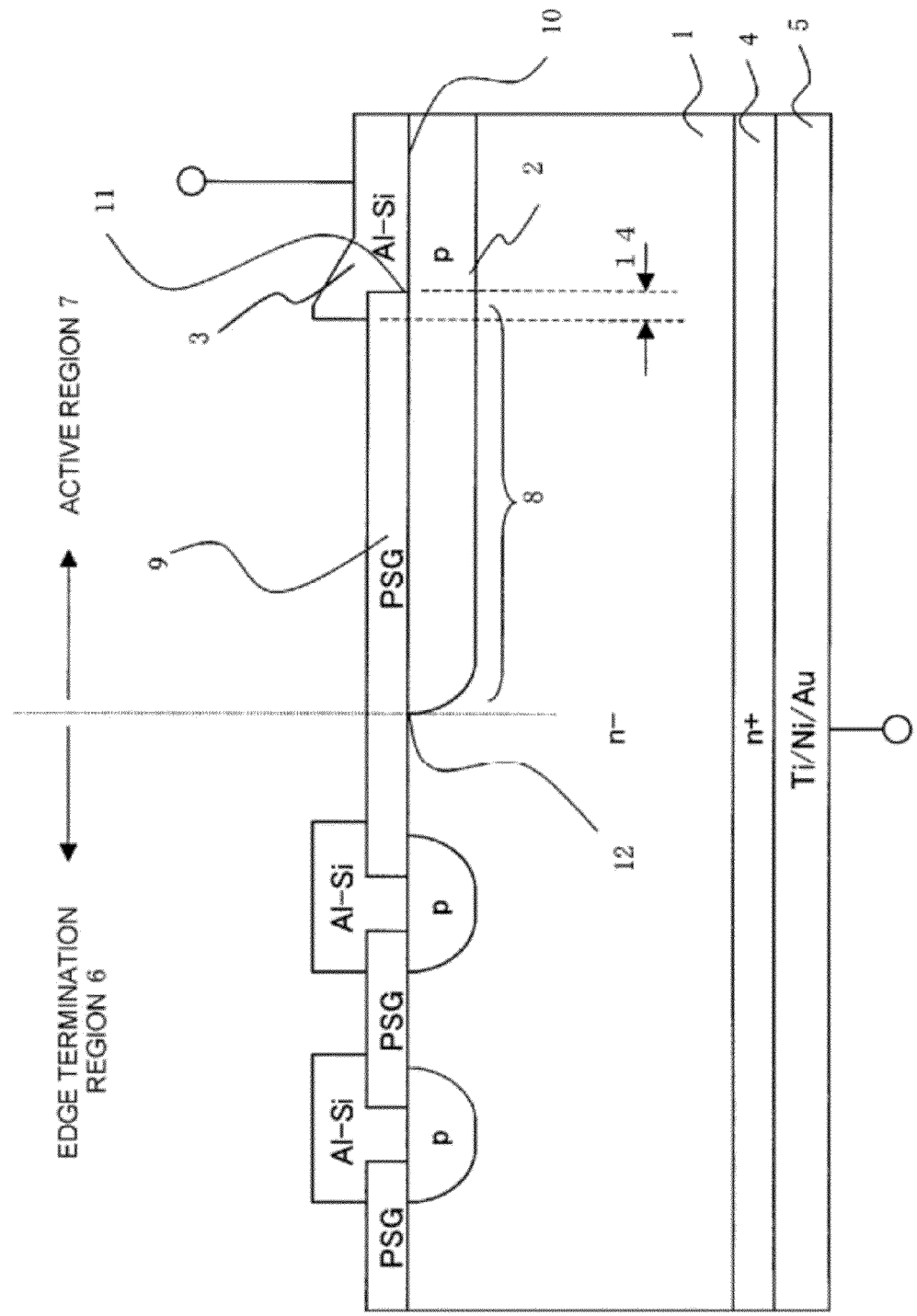
FIG. 2 is a cross-sectional view of a semiconductor device according to a second embodiment of the invention.

FIG. 2 is a cross-sectional view of a diode (FWD) according to a second embodiment of the invention. Referring now to FIG. 2, anode electrode 3 in the FWD according to the second embodiment does not include any metal field plate area extended above edge 12 of p-type anode diffusion region 2. The area of anode electrode 3 on insulator film 9 and above edge area 8 of p-type anode diffusion region 2 is withdrawn as much as possible toward ohmic contact area 10 of p-type anode diffusion region 2. The structure described above facilitates reducing the provability of short-circuiting caused by the defects in insulator film 9 beneath anode electrode 3. For example, if the area of anode electrode 3 on insulator film 9 and above edge area 8 of p-type anode diffusion region 2 is reduced by half, the provability of encountering the defects will be reduced by half and, therefore, the throughput of non-defective products will be improved. The minimum value of overlapping width 14 of anode electrode 3 and insulator film 9 allowable on the basis of the design rule for the manufacturing process determines the most effective shape of anode electrode 3.

Figure 3:
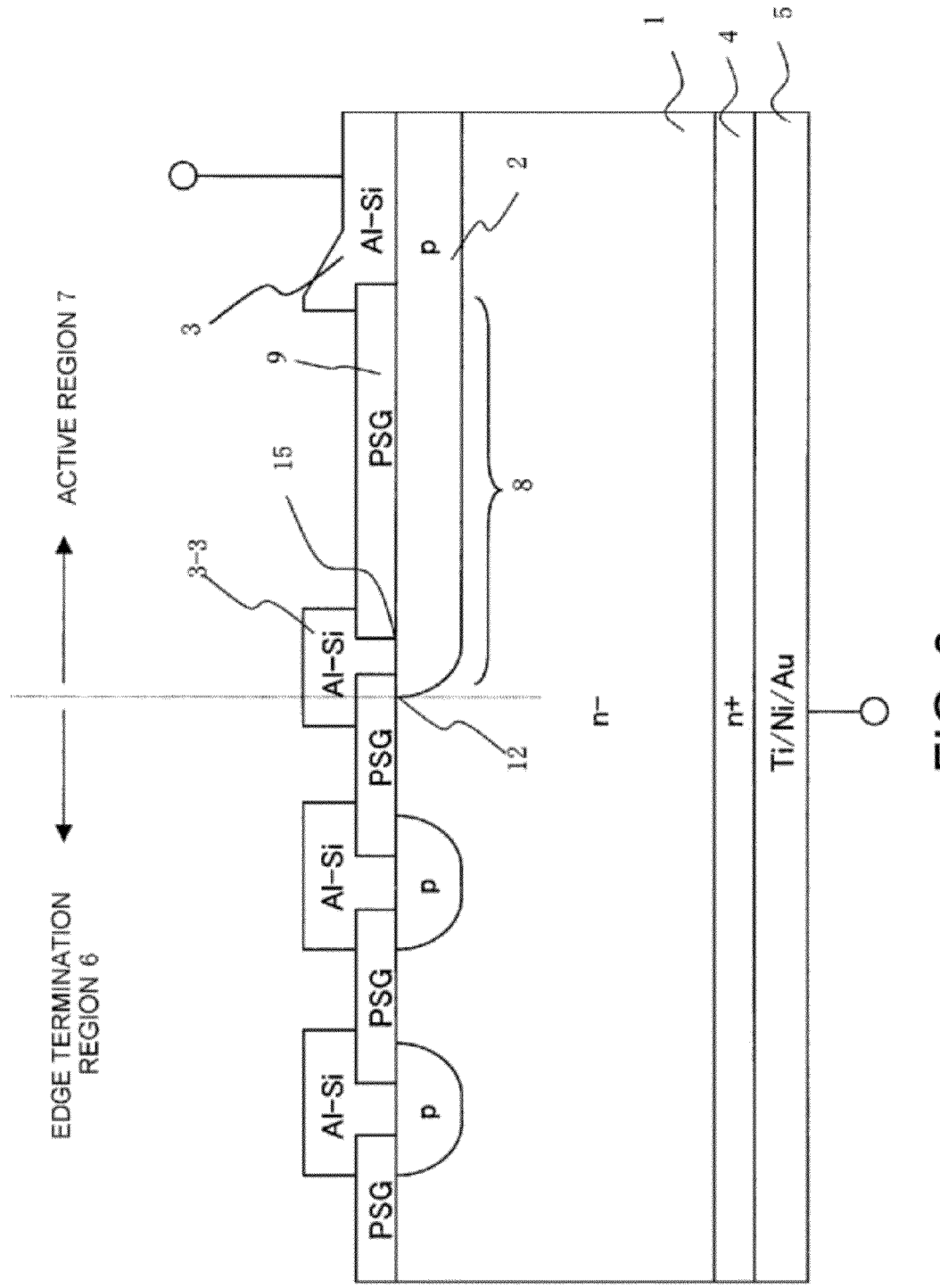
FIG. 3 is a cross-sectional view of a semiconductor device according to a third embodiment of the invention.

FIG. 3 is a cross-sectional view of a diode (FWD) according to a third embodiment of the invention. It is not necessary for the structure according to the third embodiment shown in FIG. 3 to electrically connect metal field plate 3-1 and anode electrode 3 with each other directly. Metal field plate 3-1 is formed on insulator (PSG) film 9 on edge 12 of anode diffusion region 2 for electric field relaxation in edge termination region 6. In the structure according to the third embodiment, anode electrode 3 is withdrawn in the same manner as in FIG. 2 to reduce the metal film covering insulator film 9 as much as possible.

Moreover, first metal film 3-3 exhibiting a field plate function and not connected directly to anode electrode 3 via a metal film is disposed. Moreover, opening 15 for making first metal film 3-3 in ohmic contact with p-type anode diffusion region 2 is formed through insulator film 9. An Al—Si alloy is preferable for the material of first metal film 3-3. Through opening 15, first metal film 3-3 is biased at a potential substantially the same with the potential of anode electrode 3 via p-type anode diffusion region 2. Therefore, first metal film 3-3 effectively functions for a field plate. During the reverse recovery mode of operations, electric field localization or minority carrier extraction is prevented from causing by virtue of the potential difference caused by the resistance in the surface portion (sheet resistance) of edge area 8 of p-type anode diffusion region 2.

Figure 4:
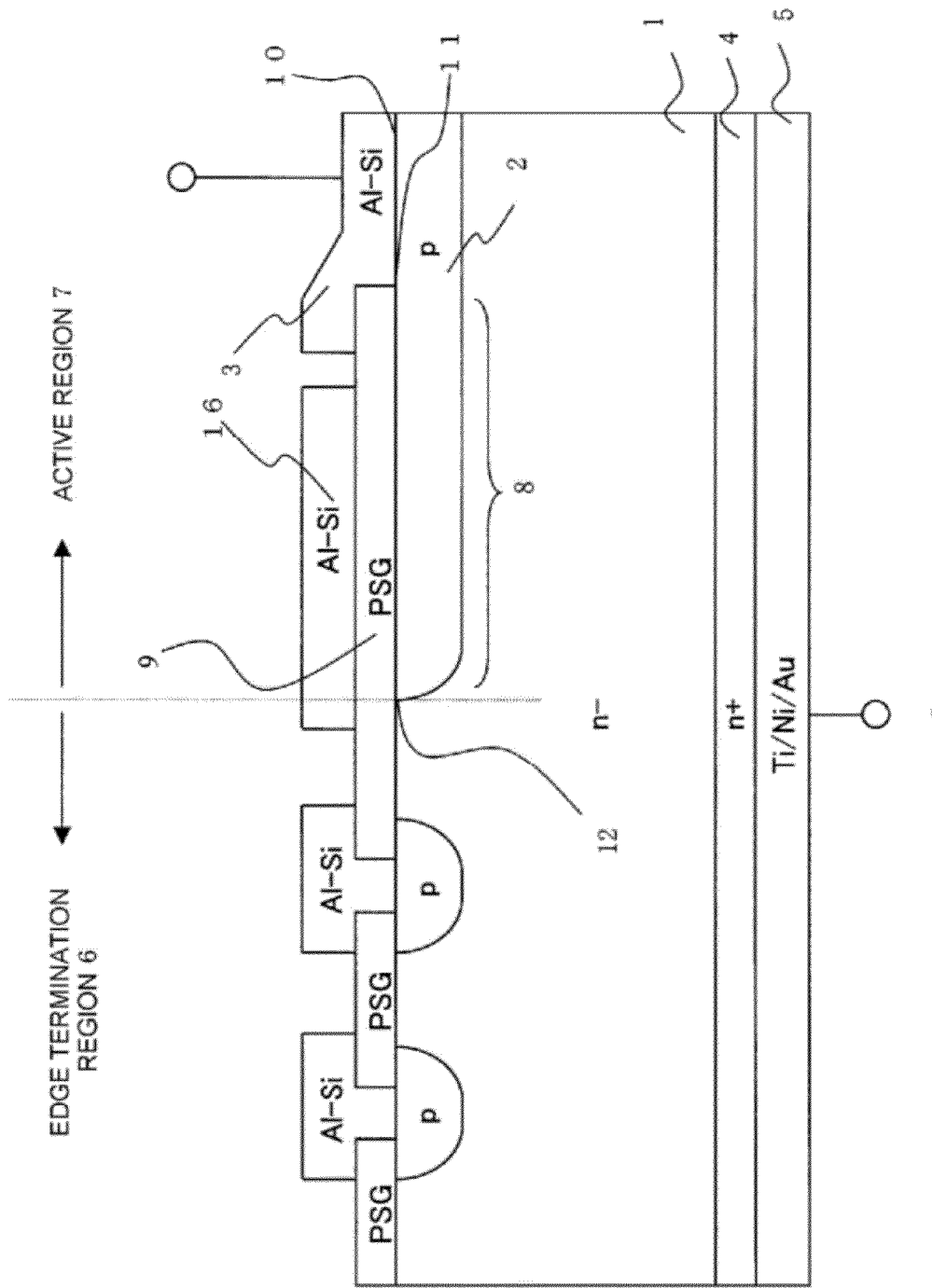
FIG. 4 is a cross-sectional view of a semiconductor device according to a fourth embodiment of the invention.

FIG. 4 is a cross-sectional view of a diode (FWD) according to a fourth embodiment of the invention. Referring now to FIG. 4, the overlap of anode electrode 3 on insulator film 9 between edge 11 of ohmic contact area 10 and edge 12 of p-type anode diffusion region 2 is minimized according to the fourth embodiment. Ohmic contact area 10 of p-type anode diffusion region 2 is in ohmic contact with anode electrode 3. Floating metal (ring-shaped second metal film) 16, electrically isolated from anode electrode 3, is disposed on insulator 9 on edge area 8 of p-type anode diffusion region 2. Floating metal 16 is disposed for providing a shield function for preventing electric charges from affecting the sheet resistance of p-type anode diffusion region 2 covered only with insulator 9. The electric charges are caused by the materials of a power module during the assemble of the diode into the power module. Especially when the impurity concentration in p-type anode diffusion region 2 is low enough to cause a surface inversion layer easily, floating metal 16 is effective to prevent the surface inversion layer from causing. Even if unintended short-circuit portions are caused between floating metal 16 and p-type anode diffusion region 2 by some kinds of defects in insulator film 9, an excellent reverse recovery withstand will be obtained, since floating metal 16 and anode electrode 3 are isolated electrically from each other.

Figure 5:
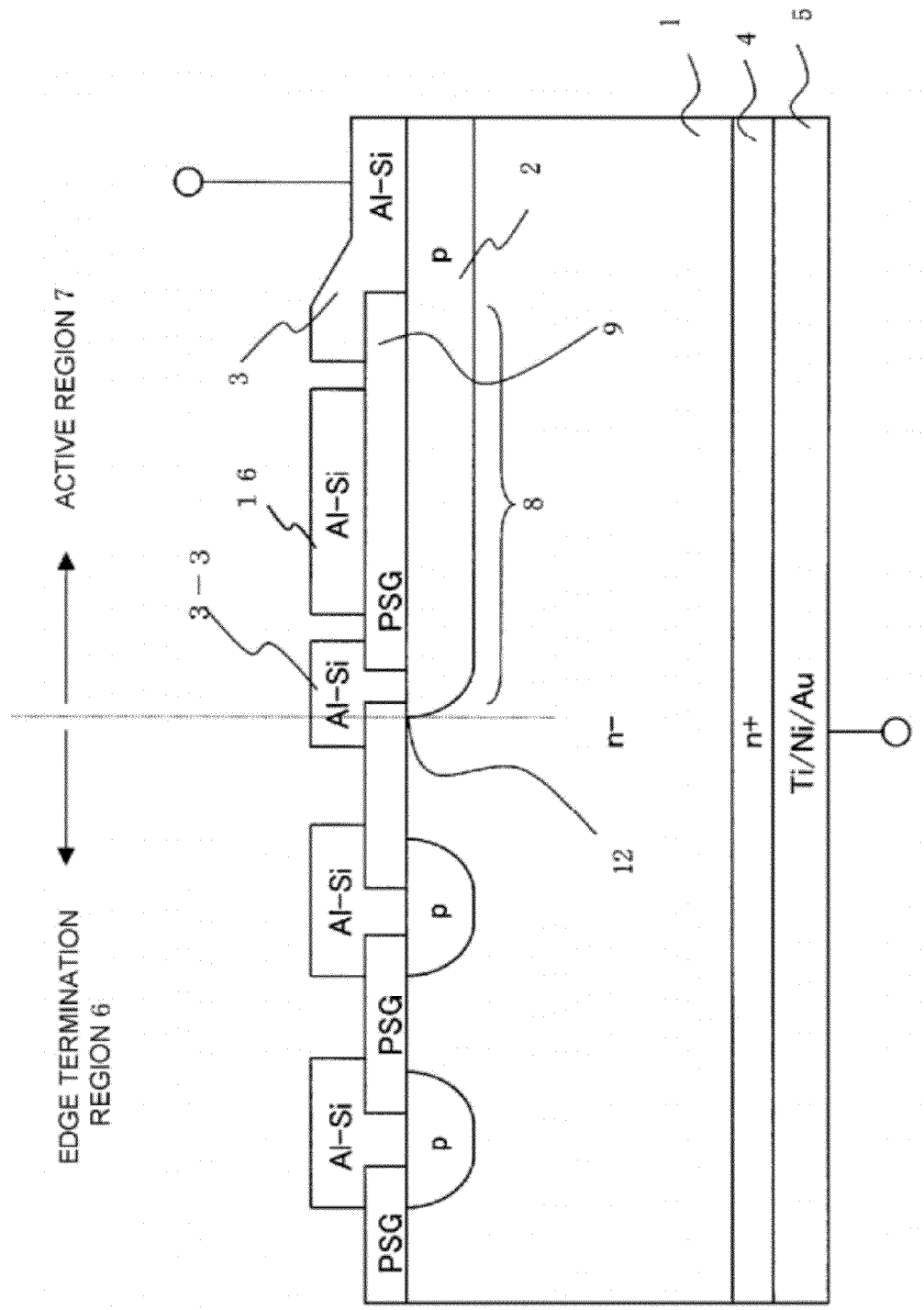
FIG. 5 is a cross-sectional view of a semiconductor device according to a fifth embodiment of the invention.

FIG. 5 is a cross-sectional view of a diode (FWD) according to a fifth embodiment of the invention. In FIG. 5, the FWD according to the fifth embodiment combines metal field plate (first metal film) 3-3, described in connection with the third embodiment and fixed at the potential of edge area 8 of p-type anode diffusion region 2, and floating metal 16 described in connection with the fourth embodiment. The combination of metal field plate (first metal film) 3-3 and floating metal 16 is effective especially when the impurity concentration in p-type anode diffusion region 2 is low enough to cause a surface inversion layer easily and it is necessary to provide edge 12 of p-type anode diffusion region 2 with a metal field plate structure for relaxing the electric field in edge termination region 6.

Figure 6:
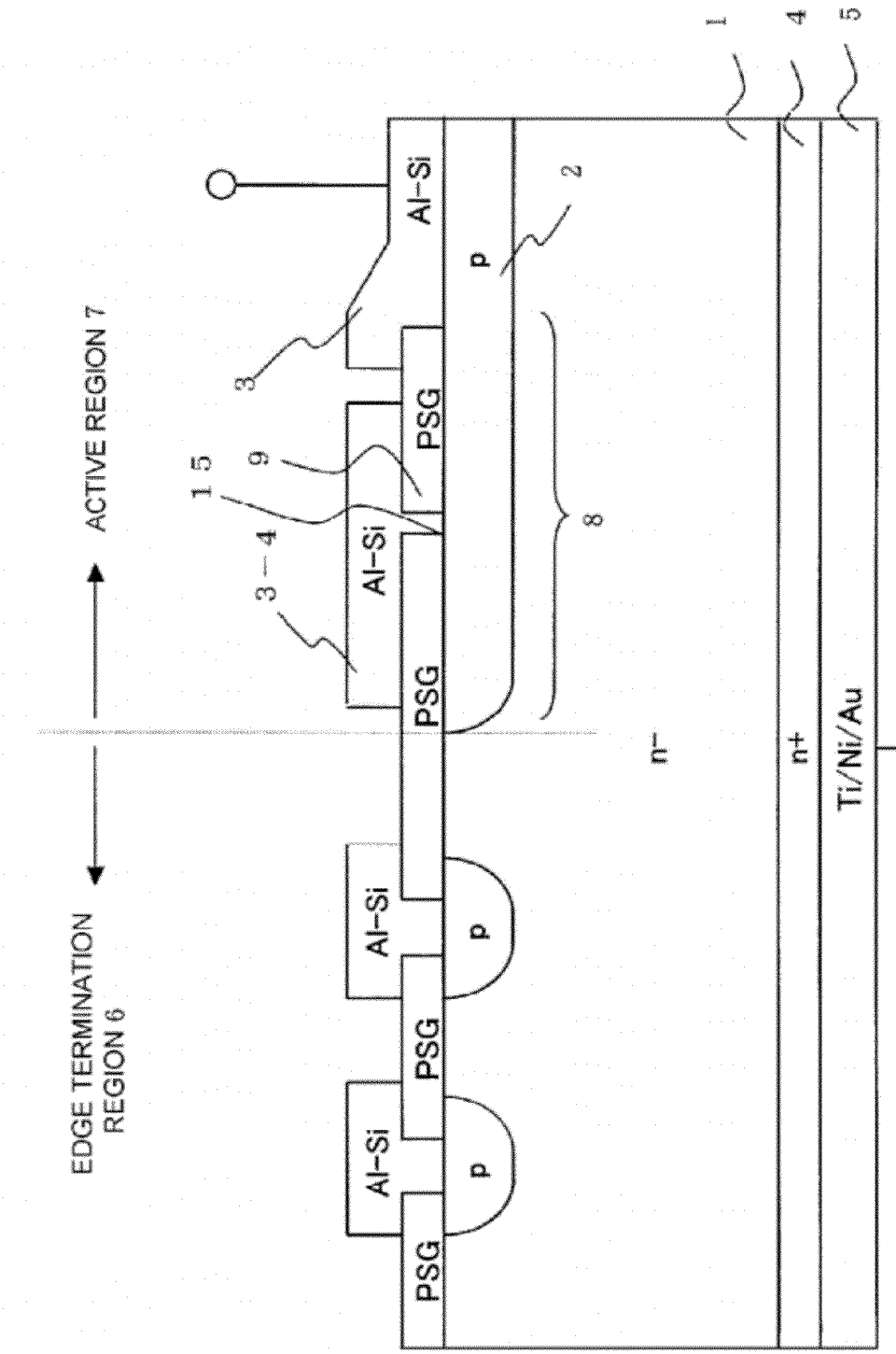
FIG. 6 is a cross-sectional view of a semiconductor device according to a sixth embodiment of the invention.

FIG. 6 is a cross-sectional view of a diode (FWD) according to a sixth embodiment of the invention. The FWD shown in FIG. 6 has a structure that facilitates preventing a characteristics variation from causing when floating metal 16 on insulator 9 used in the FWD's according to the fourth and fifth embodiments is charged up by some causes. The FWD according to the sixth embodiment includes a ring-shaped third metal film 3-4 exhibiting the function same with the function that floating metal 16 according to the fourth embodiment exhibits. Moreover, third metal film 3-4 is made to be in ohmic contact with p-type anode diffusion region 2 via opening 15. Since third metal film 3-4 is not directly connected electrically to anode electrode 3, third metal film 3-4 is hardly affected by the defects in insulator film 9.

Figure 7:
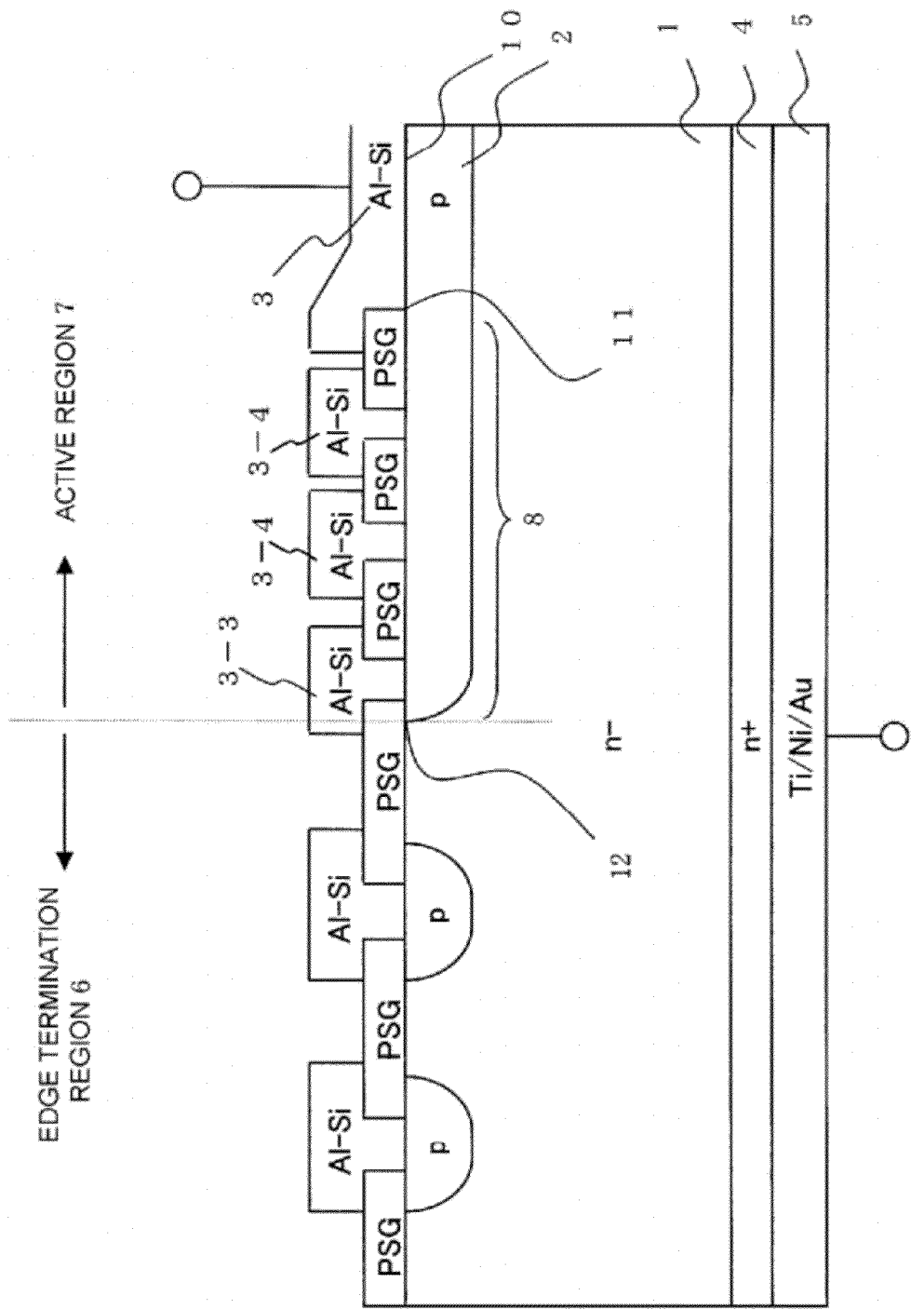
FIG. 7 is a cross-sectional view of a semiconductor device according to a seventh embodiment of the invention.

FIG. 7 is a cross-sectional view of a diode (FWD) according to a seventh embodiment of the invention. The FWD shown in FIG. 6 has a structure that combines ring-shaped metal field plate (first metal film) 3-3 fixed at the potential of edge area 8 of p-type anode diffusion region 2 and a plurality of ring-shaped third metal films 3-4. Ring-shaped metal field plate 3-3 is fixed at the potential of edge area 8 of p-type anode diffusion region 2 as described in connection with the FWD according to the third embodiment. Ring-shaped third metal film 3-4 is fixed at the potential of edge area 8 of p-type anode diffusion region 2 as described in connection with the FWD according to the sixth embodiment.

In the FWD having the structure described above, metal field plate 3-3 and third metal films 3-4 are biased at a potential corresponding to the potential of p-type anode diffusion region 2 during the reverse recovery. Since the surface of edge area 8 of p-type anode diffusion region 2 is covered almost with the metal films, a high shielding effect is obtained. Especially when the impurity concentration in p-type anode diffusion region 2 is low enough to cause a surface inversion layer easily, the structure of the FWD according to the seventh embodiment is effective to prevent the surface inversion layer from causing.

Figure 8:
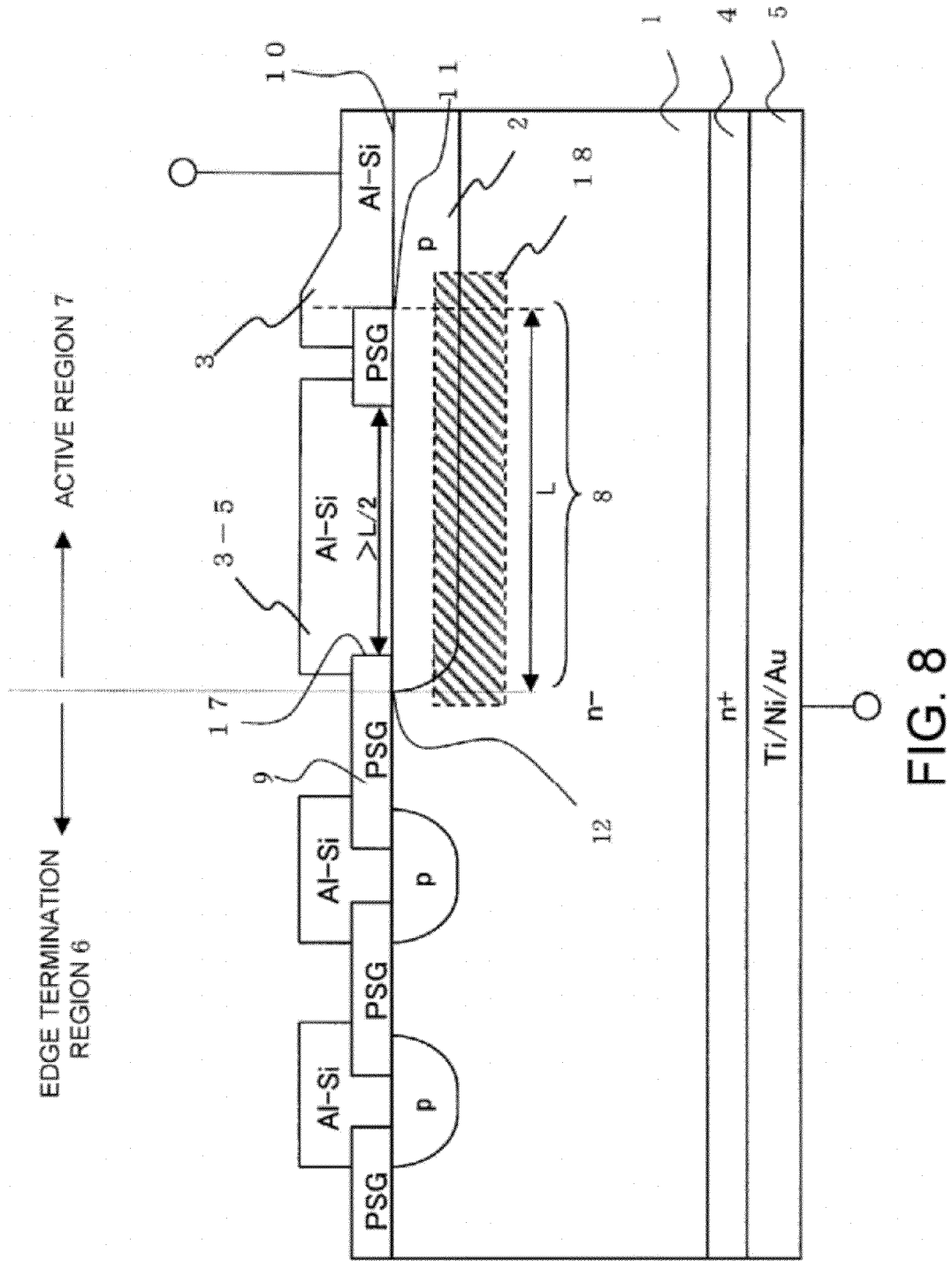
FIG. 8 is a cross-sectional view of a semiconductor device according to an eighth embodiment of the invention.

FIG. 8 is a cross-sectional view of a diode (FWD) according to an eighth embodiment of the invention. The FWD according to the eighth embodiment includes ring-shaped fourth metal film 3-5 in ohmic contact with p-type anode diffusion region 2 through wide opening 17 formed through insulator film 9. In the direction perpendicular to edge 12 of p-type anode diffusion region 2, wide opening 17 has an opening length longer than the opening length of opening 15, through which third metal film 3-4 is in ohmic contact with p-type anode diffusion region 2.

If the distance between edge 12 of p-type anode diffusion region 2 and edge 11 of ohmic contact area 10 between p-type anode diffusion region 2 and anode electrode 3 (that is the width of edge area 8 of p-type anode diffusion region 2) is represented by L, the length of opening 17 perpendicular to edge 12 of p-type anode diffusion region 2 is set to be equal to or longer than L/2.

Now the maximum length of the area of anode electrode 3 in the conventional structure above p-type anode diffusion region 2 but not in direct contact with p-type anode diffusion region 2 is set at L in the direction perpendicular to edge 12 of p-type anode diffusion region 2. If the length in the direction perpendicular to edge 12 of fourth metal film 3-5 in wide opening 17 on p-type anode diffusion region 2 is set to be equal to or longer than L/2, the length in the direction perpendicular to edge 12 of fourth metal film 3-5 on insulator film 9 will be equal to or shorter than L/2. As a result, the risk due to the provable existence of defects in the portion of insulator film 9 covered with fourth metal film 3-5 will be halved at least. Since it is necessary to consider the sheet resistance of edge area 8 of p-type anode diffusion region 2 involving fourth metal film 3-5 into the consideration in practice, the substantial sheet resistance lowers. As a result, the density of holes injected from edge area 8 of p-type anode diffusion region 2 into $n^-$-type layer 1 increases while the FWD is conducting forward operations. The increased hole density raises the electric field in the portion of $n^-$-type layer 1, therein the hole density has been raised, in reverse recovery, further raising the peak of a reverse recovery current. The high reverse recovery current peak may cause breakdown of the FWD. For the countermeasures against the electric field localization described above, it is preferable to additionally conduct lifetime control locally in the area including the bottom portion of edge area 8 and the portion of $n^-$-type layer 1 in the vicinity of the bottom portion of edge area 8 and extending across the pn-junction between edge area 8 of p-type anode diffusion region 2 and $n^-$-type layer 1 further for preventing breakdown from causing therein.

Figure 9:
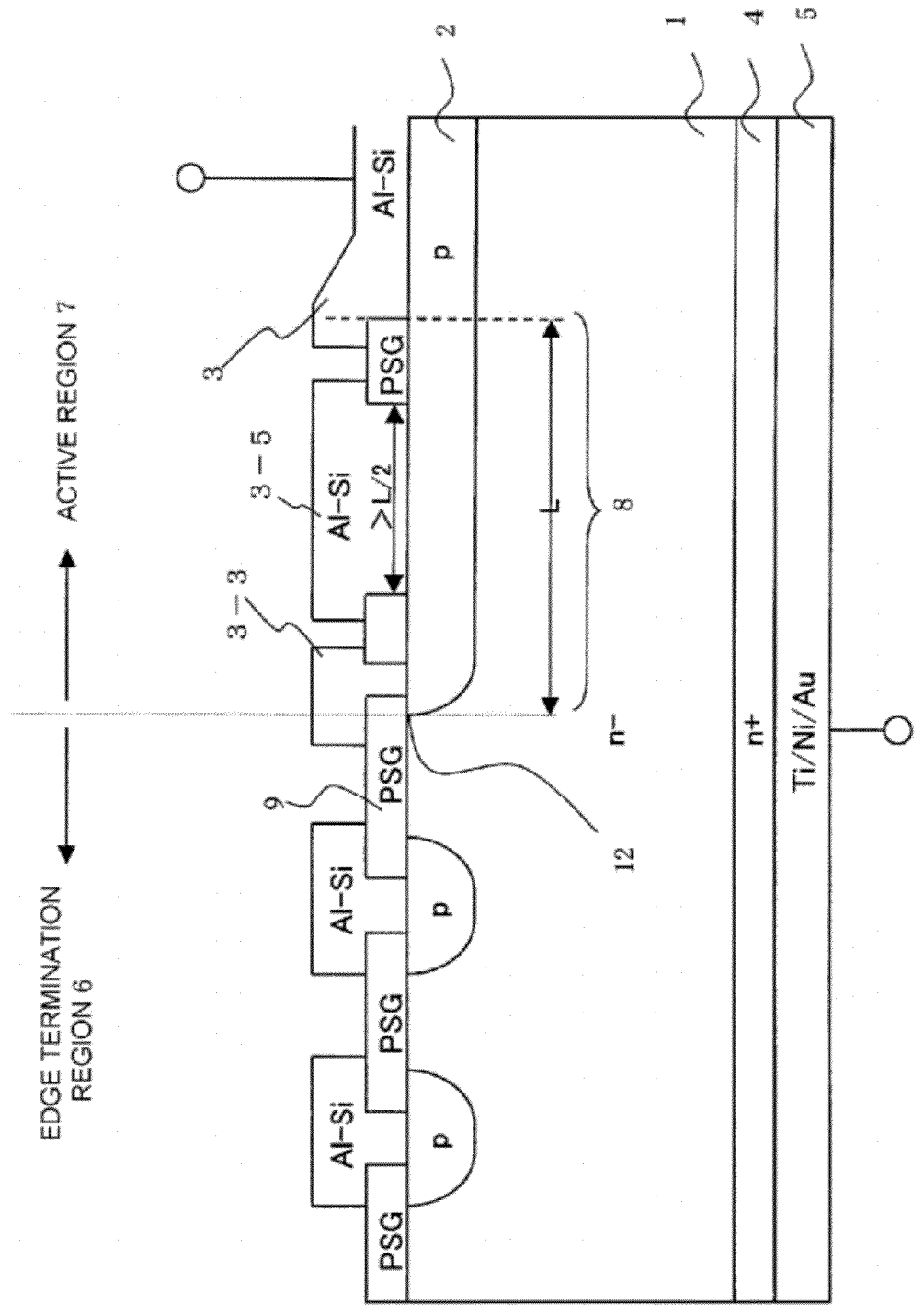
FIG. 9 is a cross-sectional view of a semiconductor device according to a ninth embodiment of the invention.

FIG. 9 is a cross-sectional view of a diode (FWD) according to a ninth embodiment of the invention. In FIG. 9, the FWD according to the ninth embodiment combines ring-shaped fourth metal film 3-5 described in connection with the eighth embodiment and first metal film 3-3 described in connection with the third embodiment. The FWD according to the ninth embodiment employs a field plate structure formed of first metal film 3-3 on edge 12 of p-type anode diffusion region 2, the surface impurity concentration thereof is low enough to cause a surface inversion layer easily. The structure of the FWD according to the ninth embodiment is hardly affected by the defects in insulator film 9 in the same manner as the FWD according to the eighth embodiment. Moreover, the structure of the FWD according to the ninth embodiment is effective to secure the electric field relaxation function of edge termination region 6.

Although not illustrated in FIG. 9, the density of holes injected from edge area 8 of p-type anode diffusion region 2 into $n^-$-type layer 1 increases while the FWD is conducting forward operations in the same manner as described in connection with the eighth embodiment. The increased hole density raises the electric field in the portion of n⁻-type layer 1, therein the hole density has been raised, in reverse recovery, further raising the peak of a reverse recovery current. The high reverse recovery current peak may cause breakdown of the FWD. For the countermeasures against the electric field localization described above, it is preferable to dispose a lifetime control region including the bottom portion of edge area 8 and the portion of n⁻-type layer 1 in the vicinity of the bottom portion of edge area 8 and extending across the pn-junction between edge area 8 of p-type anode diffusion region 2 and n⁻-type layer 1 for further preventing breakdown from causing in the lifetime control region.

Figure 10A:
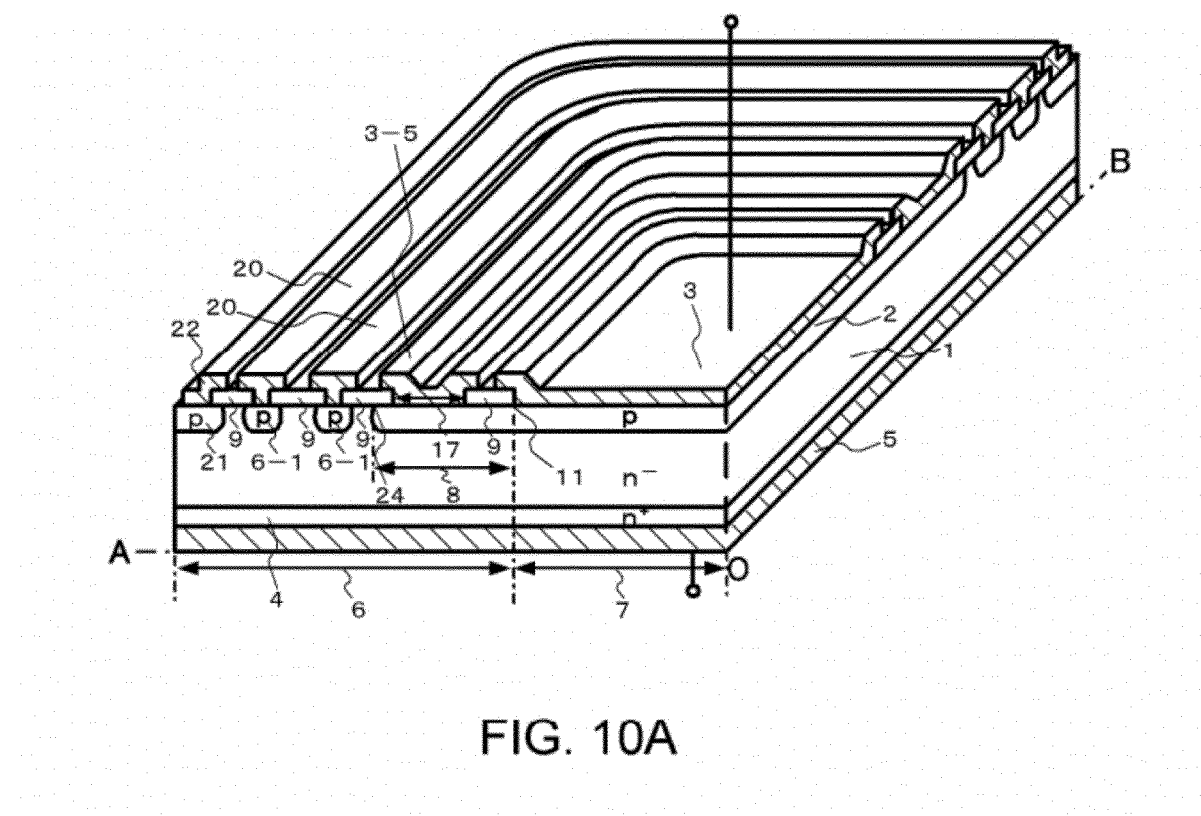
FIG. 10A is a main-portion perspective-view cross-sectional schematic diagram.
Figure 10B:
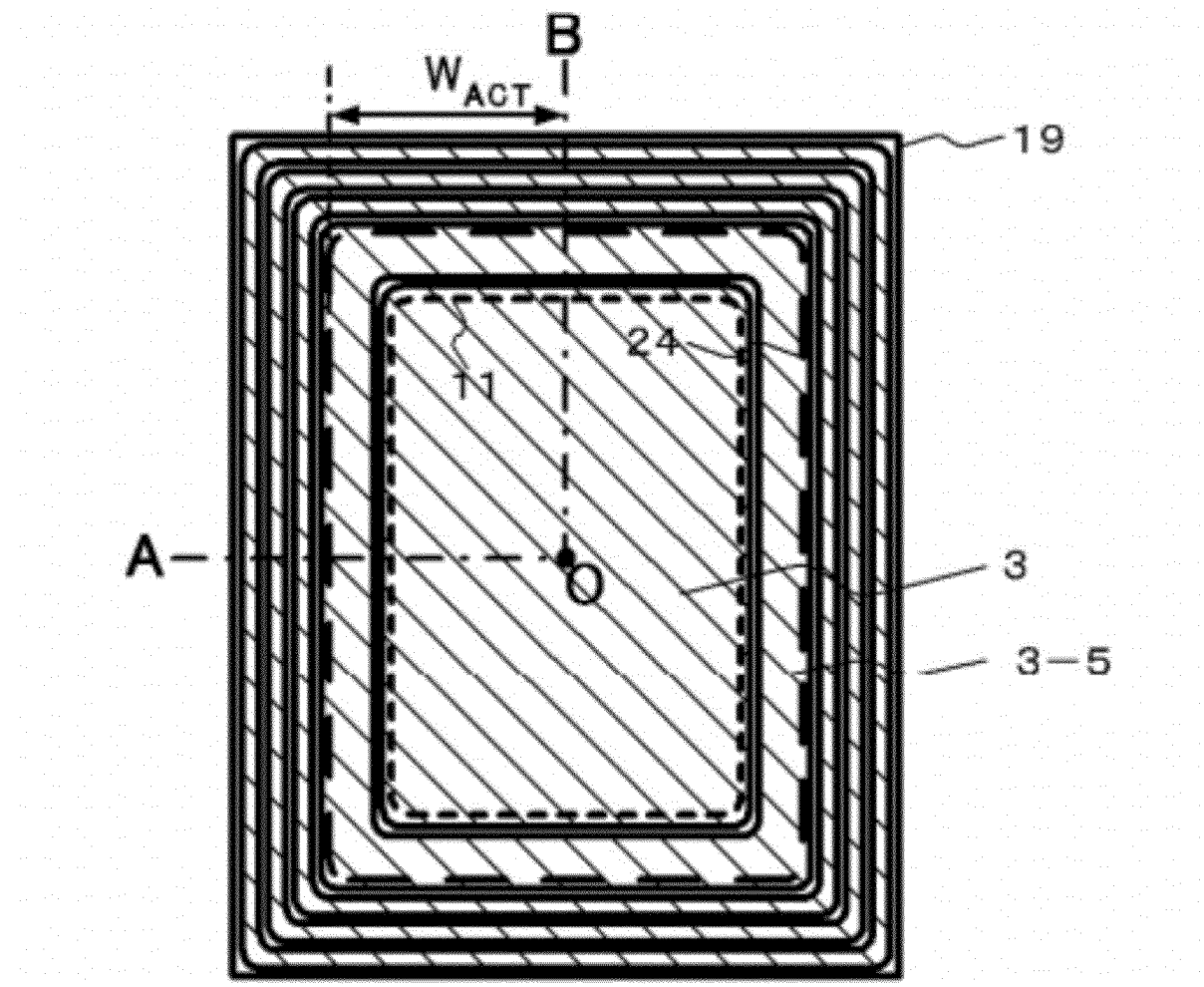
FIG. 10B is a plan view schematic diagram, illustrating a tenth embodiment of the invention.
Figure 16:
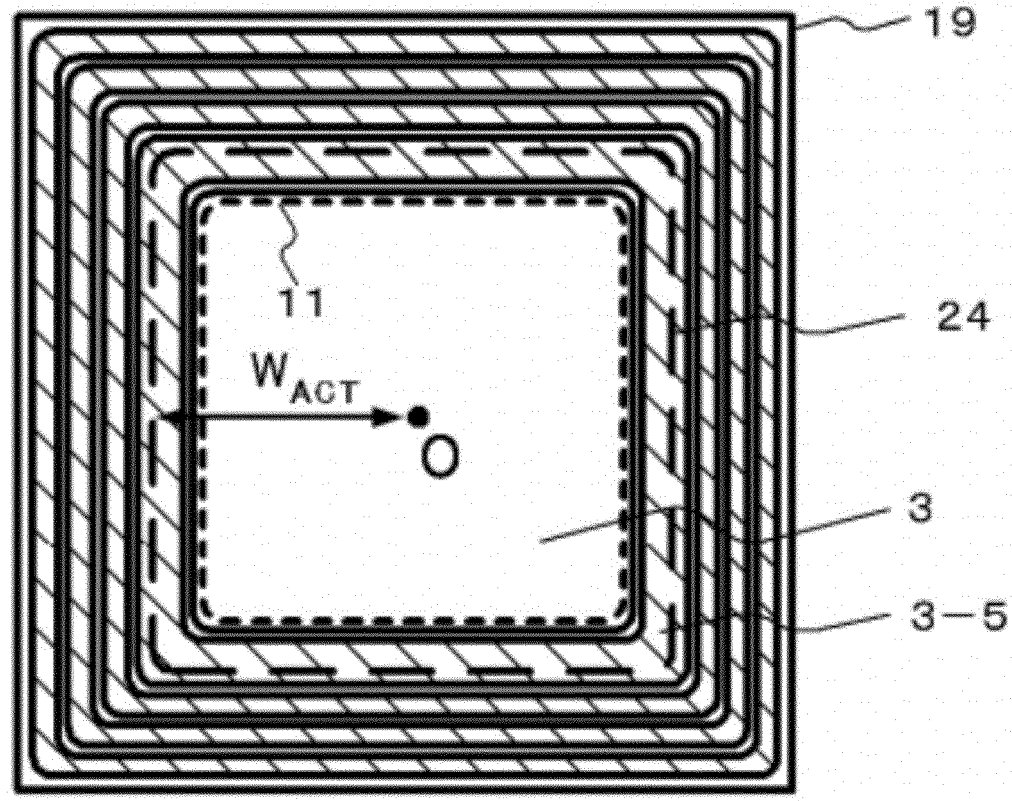
FIG. 16 is a plan view diagram illustrating a modification of the tenth embodiment of the invention.

FIG. 10A is a main-portion perspective-view cross-sectional schematic diagram and FIG. 10B is a plan view schematic diagram of a semiconductor device in a tenth embodiment. The structure in the main-portion perspective-view cross-sectional diagram in FIG. 10A is equivalent to a structure from which there is removed the portion for implementing local lifetime control as illustrated in FIG. 8 that corresponds to the above-described eighth embodiment. Specifically, the structure comprises a p-type anode diffusion region 2, and a ring-shaped fourth metal film 3-5 in ohmic contact with p-type anode diffusion region 2 through a wide opening 17 formed in an insulator film 9. Needless to say, the above-mentioned local lifetime control may be executed. FIG. 10A of a perspective-view cross-sectional diagram depicts cross sections cut along direction A and direction B from the geometrical barycenter O of the surface of p-type anode diffusion region 2 in the perspective-view of FIG. 10B (front face of the paper in the perspective view of FIG. 10B). The geometrical barycenter corresponds to the center of gravity when mass is distributed uniformly in the figure. The tenth embodiment of the invention is explained based on a p-i-n diode, but can also be easily used in, for instance, an IGBT, in which case anode electrode 3 is an emitter electrode. Besides three-terminal elements such as IGBTs, other known dual gate-type IGBTs, polysilicon diodes for temperature detection, driving circuits for gate control and the like may also be formed on the same chip of an IGBT or the like. The curvature of the corner of an outer edge 24 of p-type anode diffusion region 2 (p-base region in the case of an IGBT) is made as large as possible, given the need for alleviating electric field localization in the vicinity of the corner during application of a large reverse bias voltage to a junction with a n⁻ drift layer 1. For this reason, the shape is preferably as simple as possible, for instance a rectangular, square or circular shape. In the explanation below, the barycenter denotes the barycenter of p-type anode diffusion region 2. In the tenth embodiment of the invention and modifications thereof, the barycenter of p-type anode diffusion region 2 stands at a position O at the intersection of two diagonal lines when the semiconductor chip is substantially square shaped, for instance as illustrated in FIG. 16.

Herein, $W_{ACT}$ denotes the shortest distance from among distances of lines that extend perpendicularly from the barycenter O up to respective sides of a polygon defined by outer edge 24 of p-type anode diffusion region 2. In the plan view of FIG. 10B, for instance, the above-mentioned shortest distance is the distance $W_{ACT}$, which is the shortest distance from the barycenter O up to the side of broken line 24, leftwards on the paper. The same applies to FIG. 16. FIG. 10A also illustrates diode chip 19, floating electrode 20, stopper 21, and stopper electrode 22.

A method of manufacturing the above-described tenth embodiment is explained next. Within a resistivity range of 70 to 250 Ωcm, for instance, a thermal oxide film is formed at a temperature of 1100° C. on a first main surface (front surface) of an FZ-n type silicon substrate having a resistivity of 180 Ωcm. Thereafter, an active region portion is opened through patterning and wet etching; and then p-type anode diffusion region 2 and p-type guard rings 6-1 are formed through boron ion implantation and thermal diffusion, using the remaining thermal oxide film as a mask. The structure of the p-type anode diffusion region has, for instance, a surface concentration of $5\times10^{16}/cm^3$ and a diffusion depth from the surface of 4 μm. Edge area 8 is formed through the same ion implantation and thermal diffusion as the p-type anode diffusion region. Edge area 8 of p-type anode diffusion region 2 is manufactured thereby without increasing the number of operations, and hence cost increases can be kept in check. The p-type guard rings 6-1 may also be formed in a step different from that of p-type anode diffusion region 2, to a greater concentration and/or diffusion depth than that layer, since doing so affords safer values of electric characteristics (breakdown voltage, leakage current and so forth) during reverse bias. The interlayer insulator film 9 (for instance, a PSG film) is then deposited, an opening is formed through patterning and etching, and aluminum (containing 1% of silicon) is sputtered, followed by patterning, etching and sintering (for instance at 400° C.), to bring the aluminum into contact with the underlying silicon (in the embodiment, the p-type anode diffusion region and the p-type guard rings). Thereafter, a passivation film such as a polyimide film or an insulating silicon nitride film is formed, as the case may require, on edge termination region 6 of the surface. Next, a 100 kGy, 4.8 MeV electron beam is irradiated, from the front surface or the rear surface, to generate point defects in the n⁻ layer 1. The purpose of this step is to decrease the reverse recovery charge by reducing the lifetime of minority carriers, and to accelerate as a result the reverse recovery process. After electron beam irradiation, the lifetime value is controlled by recovering point defects to a predetermined ratio by performing a thermal treatment at a temperature range of 300 to 400° C. over a duration of between 10 minutes and 3 hours. Next, the n-type substrate is ground from the rear face side and is finished to a final substrate thickness (shortest distance from front face to rear face) in the range from 140 to 230 μm, for instance 170 μm. Phosphorus ions are implanted then in the rear face, which is then laser-annealed, for instance using a YAG 2ω (second harmonic of an yttrium aluminum garnet solid laser), to activate the implanted ions and form thereby n⁺ diffusion layer 4. Lastly, various metal films of aluminum, titanium, nickel and gold are formed in this order, by sputtering and/or vapor deposition, on the rear face, and then the wafer is diced into chips of a predetermined size. An FWD for a 1700 V breakdown voltage class is ultimately manufactured as a result. As the n-type substrate there may be used a diffusion wafer wherein phosphorus, as a n-type impurity, is diffused to a depth of 100 μm from the rear face of, for instance, a 250 μm-thick wafer, using a solid source, to form a cathode layer (n⁺ diffusion layer 4) of sufficiently high concentration. The depth of the n⁻ layer 1 from the surface is herein is 150 μm.

Figure 11A:
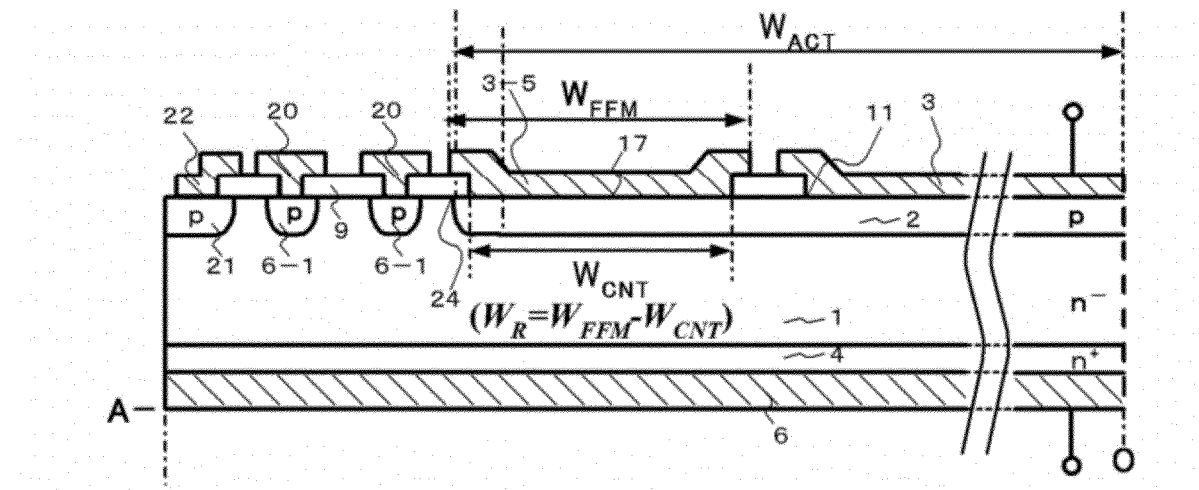
FIG. 11A is a main-portion cross-sectional diagram illustrating the tenth embodiment of the invention.
Figure 11B:
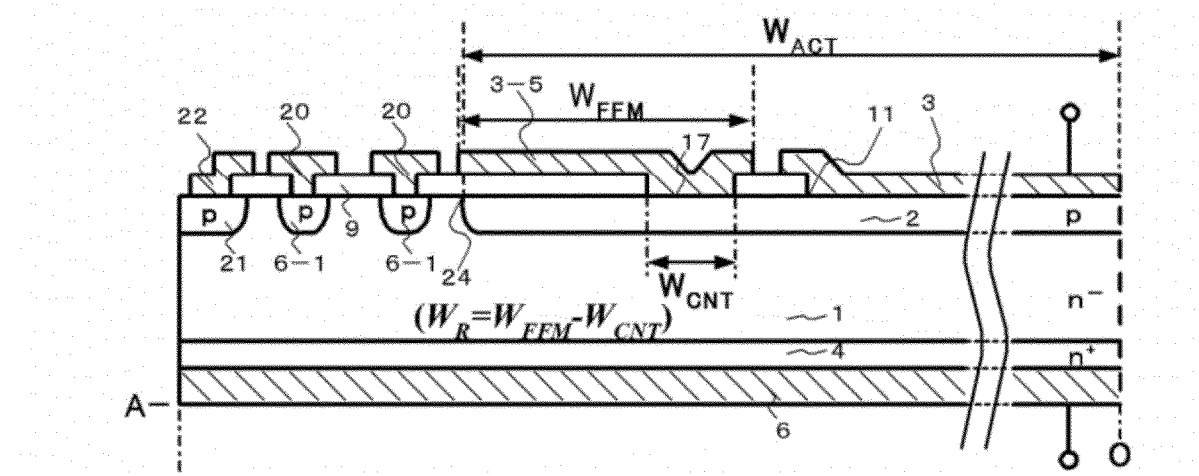
FIG. 11B is a main-portion cross-sectional diagram illustrating the tenth embodiment of the invention.
Figure 11C:
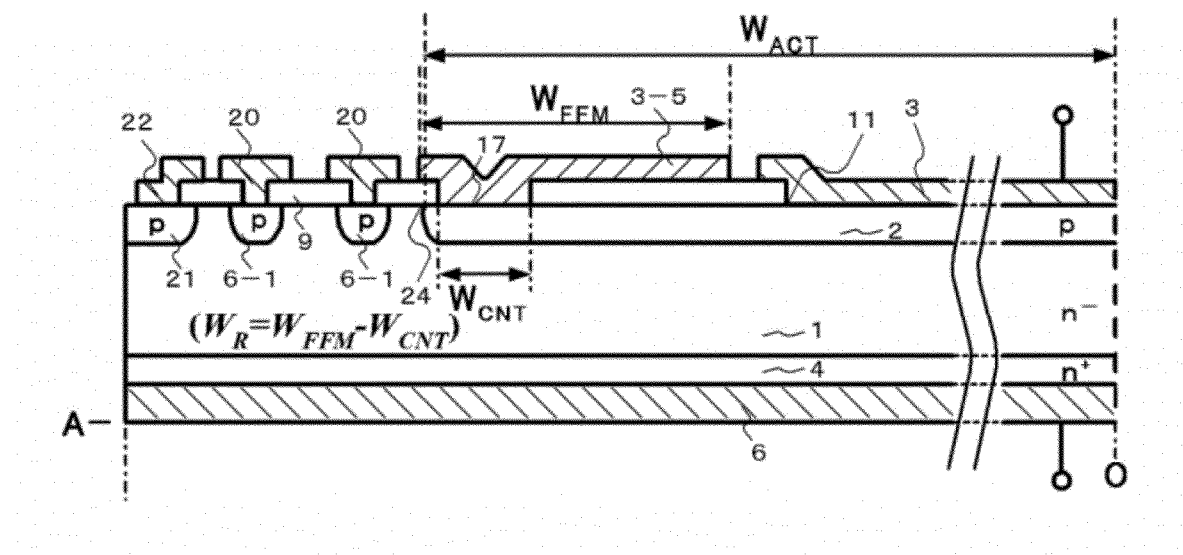
FIG. 11C is a main-portion cross-sectional diagram illustrating the tenth embodiment of the invention.

FIG. 11A, FIG. 11B and FIG. 11C are diagrams of cross sections in the tenth embodiment, for illustrating the relationship between a width $W_{CNT}$ of opening 17 formed in insulator film 9 in an edge area of p-type anode diffusion region 2 and a width $W_{FFM}$ of the ring shape of ring-shaped fourth metal film 3-5. The total width $W_R$ of the portion of ring-shaped fourth metal film 3-5 that is not in ohmic contact with p-type anode diffusion region 2 is $W_R = W_{FFM} - W_{CNT}$. The portion at the left end in the diagrams of FIG. 11A, FIG. 11B and FIG.

11C corresponds to the edge of the chip shape of the semiconductor device in the A direction in the perspective-view cross-sectional diagram in FIG. 10A, while the right end of FIG. 11A, FIG. 11B and FIG. 11C corresponds to the above-described barycenter O.

In FIG. 11A, width $W_{CNT}$ of opening 17 has a value substantially close to the distance $W_{FFM}$ in the outer peripheral direction of fourth metal film 3-5, so that the latter comes into contact with p-type anode diffusion region 2 over a wide area. In FIG. 11B, width $W_{CNT}$ of opening 17 is smaller than width $W_{FFM}$ of the ring shape of fourth metal film 3-5, and opening 17 is provided in fourth metal film 3-5, on the inward side of the semiconductor device. In FIG. 11C, opening 17 is provided in fourth metal film 3-5, but on the outward side of the semiconductor device. Any of the configurations in FIG. 11A, FIG. 11B and FIG. 11C can be adopted. During reverse recovery, however, the potential difference between anode electrode 3 and fourth metal film 3-5 increases relative to the increase in the distance between anode electrode 3 and fourth metal film 3-5. Preferably, therefore, fourth metal film 3-5 comes into contact with p-type anode diffusion region 2 over substantially the entire inner surface of fourth metal film 3-5, as illustrated in FIG. 11A, or on the inward side of the semiconductor device, as illustrated in FIG. 11B, in such a way so as to reduce the potential difference.

The forward voltage drop $V_F$ (hereinafter, simply forward voltage) in the semiconductor device of the invention depends significantly on the relationship between width $W_{FFM}$ of fourth metal film 3-5 and the shortest distance $W_{ACT}$ from among distances of lines that extend perpendicularly from the barycenter O of p-type anode diffusion region 2 up to respective sides of a polygon defined by outer edge 24 of p-type anode diffusion region 2, and depends significantly also on the relationship between $W_{ACT}$, $W_{FFM}$ and width $W_{CNT}$ of opening 17 under ring-shaped fourth metal film 3-5.

Figure 12:
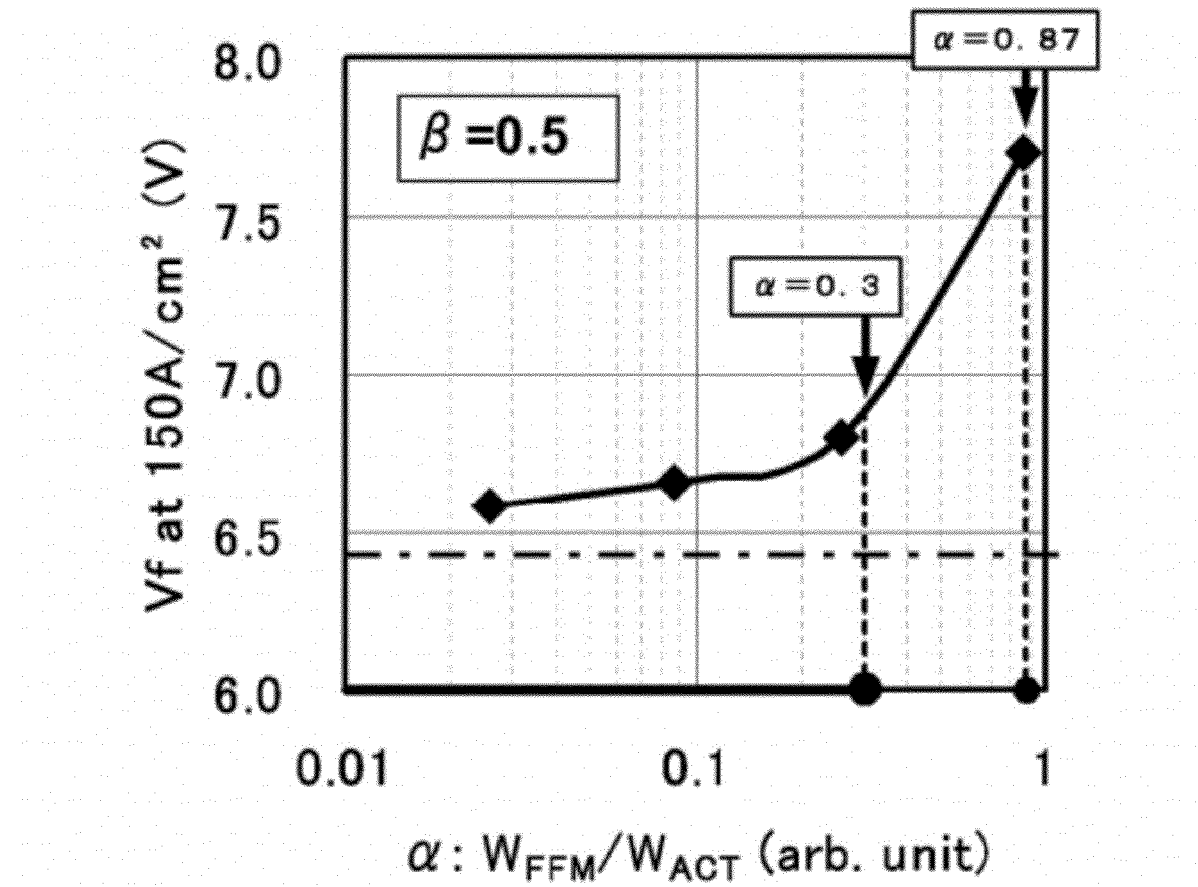
FIG. 12 is a characteristic relationship diagram of the tenth embodiment of the invention.

FIG. 12 is a characteristic relationship diagram (graph) illustrating the dependence of the forward voltage $V_F$, at a forward current density of 150 A/cm$^2$, relative to a ratio $\alpha$ of $W_{FFM}$ to $W_{ACT}$ ($\alpha = W_{FFM}/W_{ACT}$) in the semiconductor device of the invention. Herein, forward current density denotes current per unit area obtained by dividing the current flowing in the forward direction by the surface area of the semiconductor chip. A ratio $\beta$ ($\beta = W_{CNT}/W_{FFM}$) of width $W_{CNT}$ of opening 17 relative to width $W_{FFM}$ of the ring shape of ring-shaped fourth metal film 3-5 is introduced herein. FIG. 12 illustrates a characteristic in a case where $\beta = 0.5$, i.e. a case where $W_{CNT}$ and the above-described $W_R$ ($= W_{FFM} - W_{CNT}$) are identical. In the present embodiment, $W_{FFM} = 260$ µm. Therefore, $\alpha = 0.87$ means that $W_{ACT} = 300$ µm, and $\alpha = 0.3$ means that $W_{ACT} = 867$ µm. The graph in FIG. 12 shows that the forward voltage $V_F$ increases as $\alpha$ increases, and that the forward voltage $V_F$ increases abruptly to a very high value when $\alpha > 0.3$. The magnitude of $W_{ACT}$ influences the magnitude of the surface area (active surface area) of the active portion. As a result, the value of the forward voltage increases as the active surface area becomes smaller. The correspondences between the dimensions of these parameters are summarized for $\alpha$ in Table 1 and for $\beta$ in Table 2. In the case of, for instance, a 1700 V class, the range of typical values for width $W_{FFM}$ of the fourth metal film is about 150 to about 400 µm, and is 260 µm in the present embodiment.

TABLE 1

| Active portion distance $W_{ACT}$ (µm) | Fourth metal film width $W_{FFM}$ (µm) | $\alpha$ $W_{FFM}/W_{ACT}$ (arb. unit) |
|---|---|---|
| 300 | 260 | 0.87 |
| 867 | 260 | 0.30 |
| 1000 | 260 | 0.26 |
| 3000 | 260 | 0.09 |
| 10000 | 260 | 0.03 |

TABLE 2

| Fourth metal film width opening width $W_{CNT}$ (µm) | Fourth metal film width $W_{FFM}$ (µm) | $W_R$ $W_{FFM} - W_{CNT}$ (µm) | $\beta$ $W_{CNT}/W_{FFM}$ (arb. unit) |
|---|---|---|---|
| 6 | 260 | 254 | 0.02 |
| 30 | 260 | 230 | 0.12 |
| 65 | 260 | 195 | 0.25 |
| 145 | 260 | 115 | 0.56 |
| 230 | 260 | 30 | 0.88 |

Figure 13:
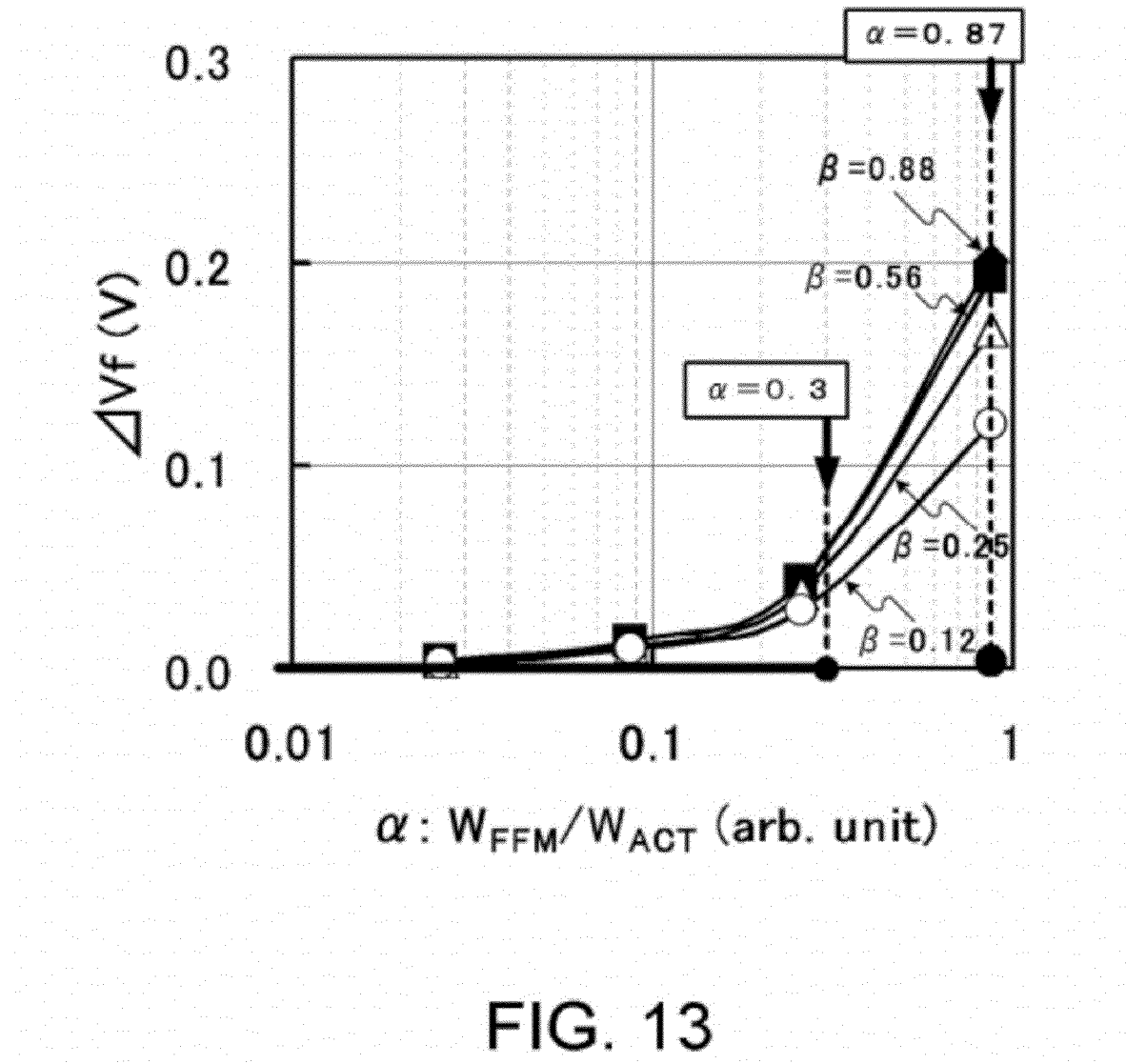
FIG. 13 is a characteristic relationship diagram of the tenth embodiment of the invention.

FIG. 13 illustrates the dependence on $\alpha$ of $\Delta V_F$, defined as the difference between forward voltage at various $\beta$ with the forward voltage when $\beta = 0.02$, i.e. when $W_{CNT}$ is 6 µm, for a given $\alpha$. The figure shows that when $\alpha = 0.87$, specifically, when $W_{ACT}$ is sufficiently small, having about the same length as width $W_{FFM}$ of the ring shape of fourth metal film 3-5, the forward voltage difference $\Delta V_F$ increases as the value of $\beta$ approaches 1, i.e. as width $W_{CNT}$ of opening 17 under fourth metal film 3-5 approaches width $W_{FFM}$ of fourth metal film 3-5. That is, the static potential distribution at the lower portion of fourth metal film 3-5 changes on account of the influence of the width of the active region as the latter becomes narrower, whereupon the forward voltage difference $\Delta V_F$ changes accordingly.

Figure 15A:
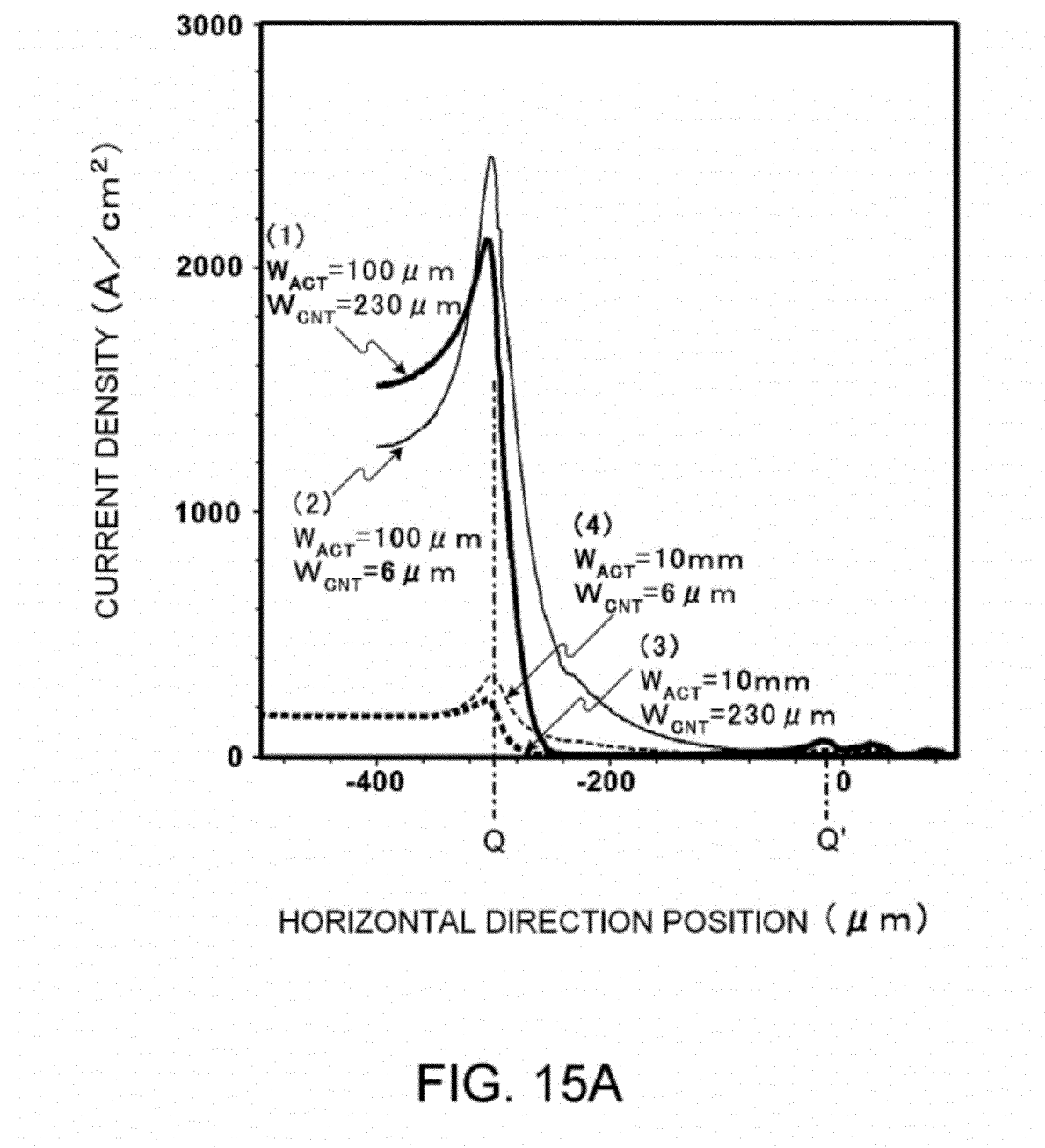
FIG. 15A is a current density distribution diagram.
Figure 15B:
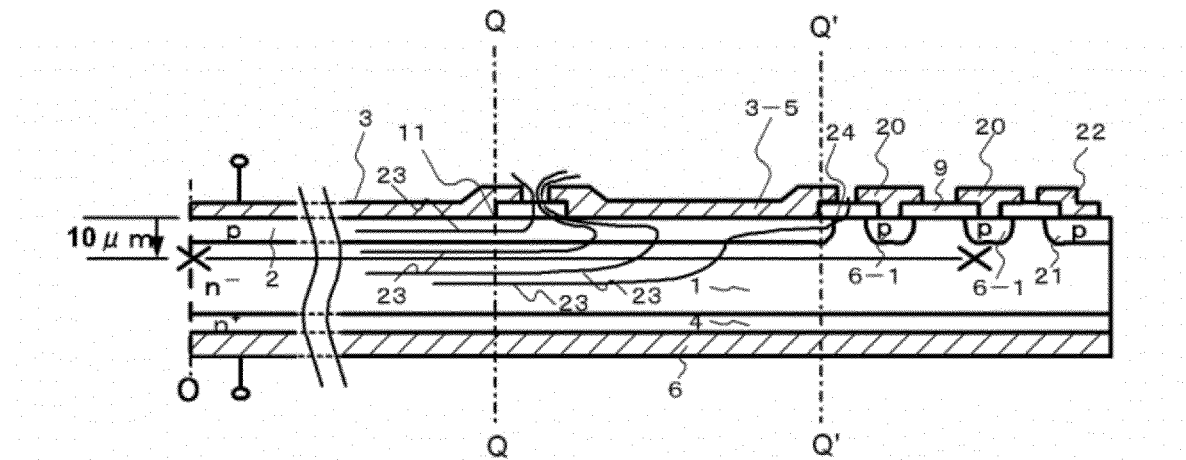
FIG. 15B is a main-portion cross-sectional diagram illustrating characteristic relationships in the tenth embodiment of the invention.
Figure 15C:
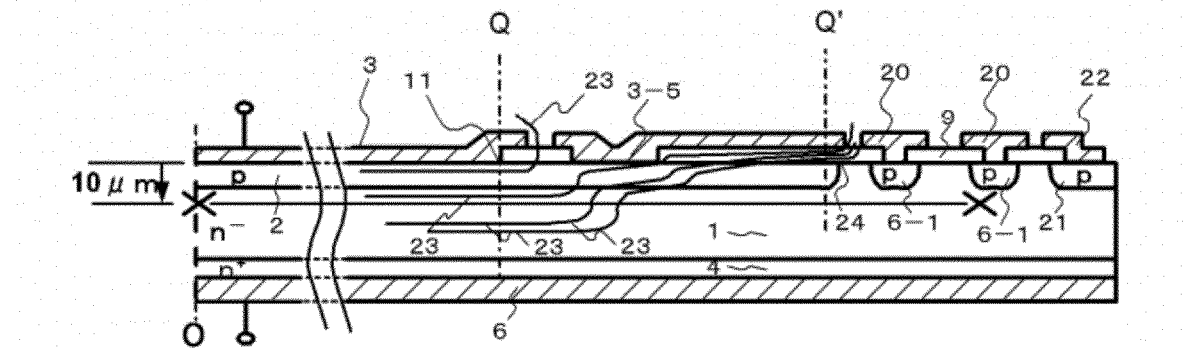
FIG. 15C is a main-portion cross-sectional diagram illustrating characteristic relationships in the tenth embodiment of the invention.

This result can be explained using schematic diagrams of current density distribution and equipotential line distribution obtained by semiconductor device simulation, as illustrated in the cross-sectional view of FIG. 15B, the cross-sectional view of FIG. 15C and the current density distribution diagram in FIG. 15A at a position indicated by x marks, at a depth of 10 µm from the surface, in FIGS. 15B and 15C. The cross-sectional view of FIG. 15B corresponds to a case where $\beta = 0.88$, i.e. $W_{CNT} = 230$ µm, while the cross-sectional view of FIG. 15C corresponds to a case where $\beta = 0.02$, i.e. $W_{CNT} = 6$ µm. Both cross-sectional diagrams illustrate the distribution of four equipotential lines 23 for 1 V steps during forward conduction. When width $W_{CNT}$ of opening 17 under fourth metal film 3-5 is sufficiently large, the potential (electrostatic potential) below opening 17 (peripheral region 8) during conduction is widely fixed at a lower potential than that of the anode electrode, as in the cross-sectional view of FIG. 15B. As a result, carriers (electrons, holes) cannot intrude from outer edge 11 of the portion where anode electrode 3 is in ohmic contact with p-type anode diffusion region 2, into the edge area. In particular, when $W_{CNT}$ is sufficiently wide and $W_{ACT}$ is small (i.e. when $\alpha$ is small), as denoted by (1) in the current density distribution diagram in FIG. 16A, the cross section of the current path becomes narrower, and the current density in the active portion becomes higher in proportion, as compared with the case (2), where $W_{CNT}$ is sufficiently narrow. As a result, the forward voltage drop in (1) is higher than in (2), which gives rise to a forward voltage difference $\Delta V_F$. Meanwhile, when $W_{ACT}$ (i.e. $\alpha$) is sufficiently large, the influence of $W_{CNT}$ decreases, and hence the difference in the current density in the active region becomes so small as to be negligible, as depicted in (3) and (4) of the current density distribution diagram in FIG. 16A. The forward voltage difference $\Delta V_F$ as well becomes sufficiently small as a result. The relative maxima shown in FIG. 15A correspond to portions of cross-sectional views of FIG. 15B and FIG. 15C marked with the lines Q and Q', respectively.

Figure 14:
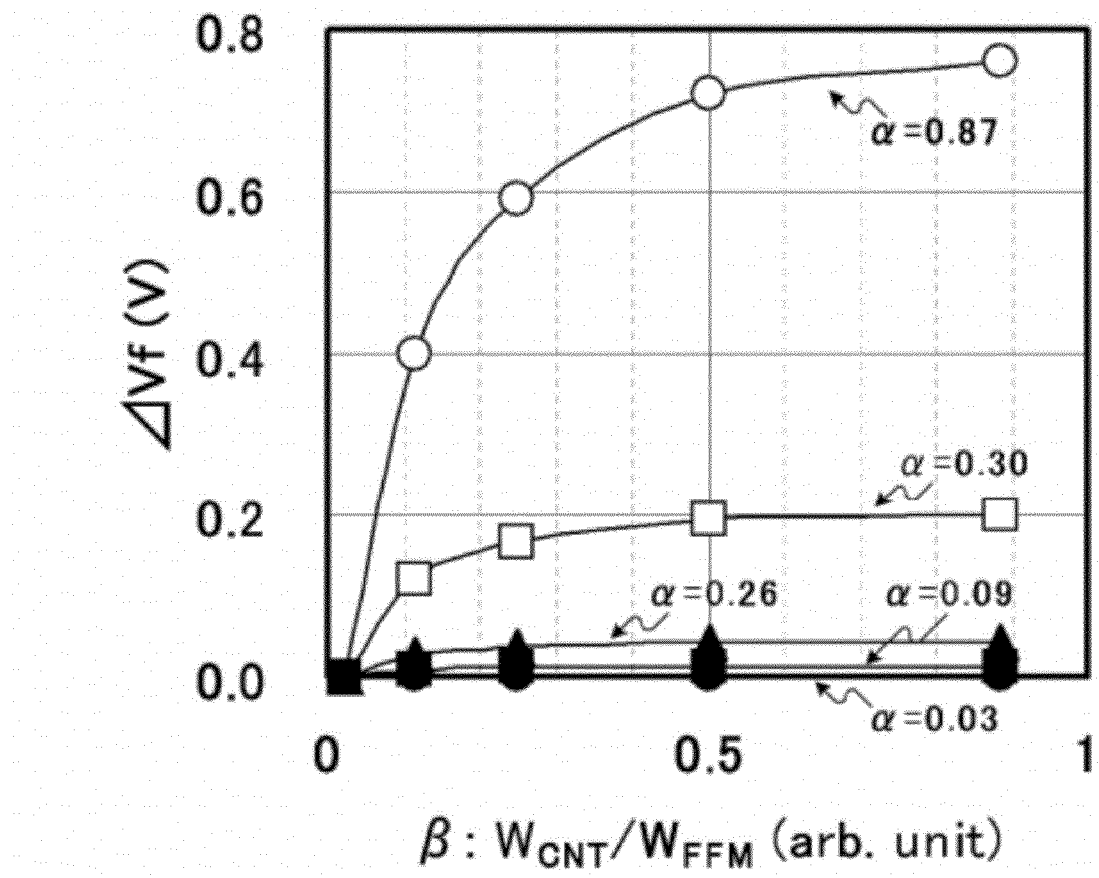
FIG. 14 is a characteristic relationship diagram of the tenth embodiment of the invention.
Figure 17:
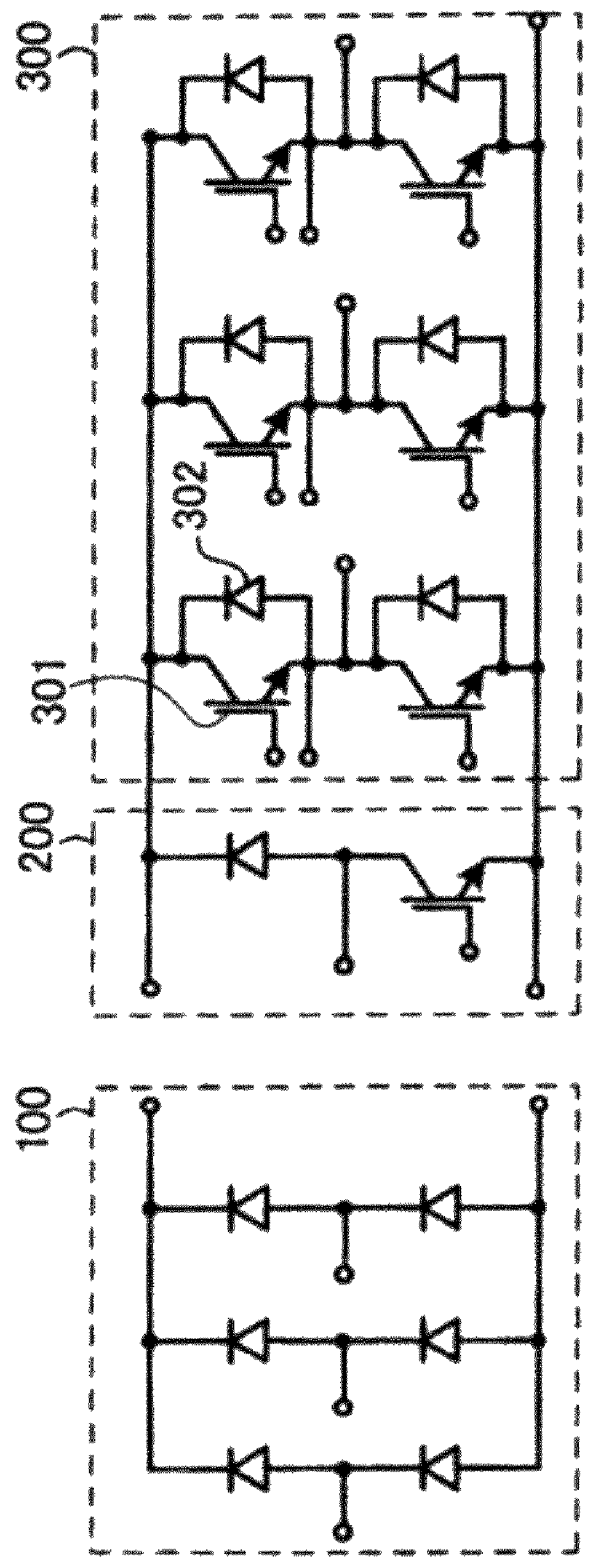
FIG. 17 is a circuit diagram of a conventional power converter.
Figure 18:
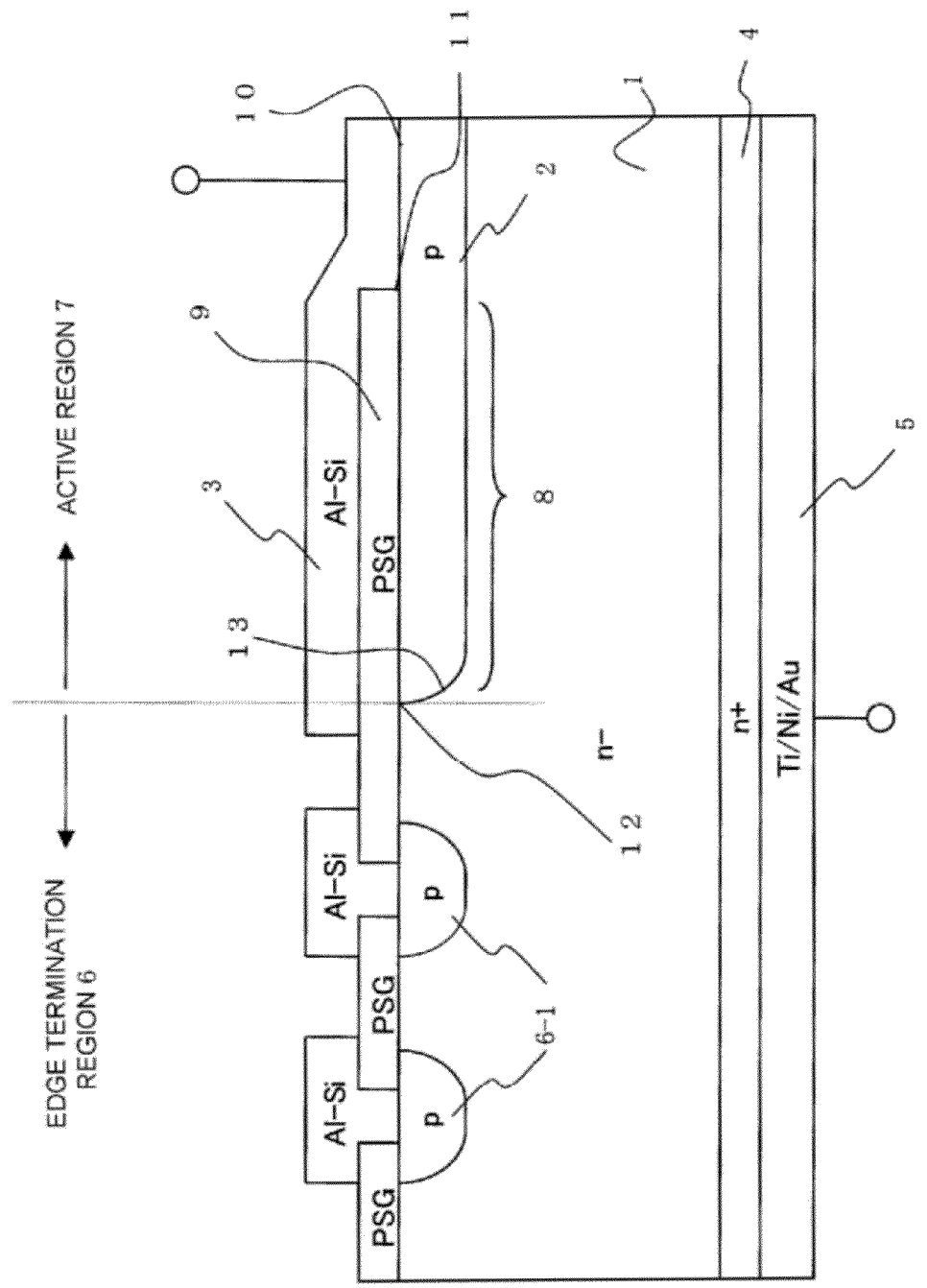
FIG. 18 is a cross-sectional view of the conventional FWD that exhibits an improved reverse recovery withstand.

FIG. 14 is a graph illustrating characteristic relationships in the tenth embodiment. The graph depicts the dependence of the forward voltage difference $\Delta V_F$ of FIG. 13 on the ratio β of width $W_{CNT}$ of opening 17 relative to width $W_{FFM}$ of the ring shape of fourth metal film 3-5. The dependence is plotted for various values of α. The forward voltage difference $\Delta V_F$ increases when α is equal to or greater than 0.3, i.e. when width $W_{FFM}$ of fourth metal film 3-5 approaches the value of $W_{ACT}$. Herein, the forward voltage difference $\Delta V_F$ stabilizes and depends no longer on β when β is 0.5 or greater, i.e. when width $W_{CNT}$ of opening 17 is greater than the total width $W_R$ of the portion of fourth metal film 3-5 that is not in ohmic contact with p-type anode diffusion region 2. This effect can be explained with reference to FIG. 17. Specifically, the width over which the electrostatic potential below opening 17 (peripheral region 8) is fixed to a lower potential than that of the anode electrode during conduction can be increased when width $W_{CNT}$ of opening 17 under fourth metal film 3-5 is sufficiently greater than then total width $W_R$ of the portion of fourth metal film 3-5 that is not in ohmic contact, as illustrated in cross-sectional view of FIG. 15B. As a result, both the distribution of equipotential lines and the forward voltage difference $\Delta V_F$ are stabilized with respect to changes in width $W_{CNT}$ of opening 17.

Such stability of the forward voltage difference $\Delta V_F$ affords an extremely important effect in terms of characteristic stability in the embodiment of the invention, since it is accompanied by lesser susceptibility to, for instance, variability arising in the manufacturing process of the semiconductor device, in terms of alignment errors between the interlayer insulator film 9 and fourth metal film 3-5 during mask patterning, precision of the etching width during forming of opening 17, and the in-plane distribution of the foregoing on the silicon wafer.

The smallest width of $W_{FFM}$ may be 10 μm. That is because when the above-described lifetime control is performed, the diffusion length of the minority carriers is of about 1 μm. A $W_{FFM}$ smaller than this value would cancel the above-described electrostatic potential fixing effect, and would preclude preventing minority carriers from intruding from outer edge 11 into edge area 8. To stably suppress intrusion of minority carriers into edge area 8 by widely fixing the potential in the vicinity of the fourth metal film, the $W_{FFM}$ may be 10 or more times the above-described diffusion length. Hence, the minimum width of $W_{FFM}$ is preferably about 10 μm.

For the above reasons, therefore, α may be no greater than 0.3 in the tenth embodiment of the invention, i.e. width $W_{FFM}$ of the ring shape of fourth metal film 3-5 may have a value no greater than 30% of the distance $W_{ACT}$, which is the shortest distance $W_{ACT}$ from among distances of lines that extend to outer edge 24 from the barycenter O of the p-type anode diffusion region perpendicularly to respective sides of a polygon defined by outer edge 24 of the p-type anode diffusion region, and at the same time, β may be greater than 0.5, i.e. width $W_{CNT}$ of opening 17 may be greater than the total width $W_R$ of the portion of fourth metal film 3-5 that is not in ohmic contact with anode diffusion region 2.

The tenth embodiment of the invention has been explained for a 1700 V breakdown voltage class, but the invention easily can be applied to other breakdown voltage classes. In the case of the 600 V class, for instance, the resistivity of the silicon semiconductor substrate ranges from about 10 to about 50 Ωcm, and the thickness of the n⁻ drift layer 1 from about 40 to about 70 μm. Width $W_{ACT}$ varies depending on the setting of the rated current density of the product, but ranges from about 300 to about 10000 μm (=10 mm), as in Table 1. Since resistivity is small, width $W_{FFM}$ of the ring shape of fourth metal film 3-5 has a smallest width of 10 μm or greater, and ranges typically from about 50 to about 200 μm. As is the case above, α preferably is no greater than 0.3. Therefore, the value of β that determines the width of opening 17 preferably is not smaller than 0.5, as is the case above. In the 1200 V class, the resistivity of the silicon semiconductor substrate ranges from about 40 to about 90 Ωcm, the thickness of n⁻ drift layer 1 from about 100 to about 150 μm, and width $W_{FFM}$ of the ring shape of fourth metal film 3-5 ranges from about 100 to about 300 μm. In the 3300 V class, the resistivity of the silicon semiconductor substrate ranges from about 200 to about 400 Ωcm, the thickness of n⁻ drift layer 1 from about 200 to about 400 μm and width $W_{FFM}$ of the ring shape of the fourth metal film ranges from about 200 to about 500 μm. In all the above cases, α may be no greater than 0.3 and β not smaller than 0.5.

As described above, the FWD's according to the invention hardly cause reverse recovery breakdown even if defects are caused in the insulator film during the chip manufacturing process.

What is claimed is:

1. A semiconductor device comprising:
   a semiconductor substrate of a first conductivity type, having a first major surface;
   an anode diffusion region of a second conductivity type, formed in a surface portion on a side of the semiconductor substrate that includes the first major surface, the anode diffusion region having an edge area;
   an edge termination region surrounding the anode diffusion region;
   an anode electrode disposed on the anode diffusion region, the anode electrode including an ohmic contact area in ohmic contact with the anode diffusion region and an electrode area, the electrode area located directly above the edge area of the anode diffusion region and between an edge of the ohmic contact area adjacent to the edge area of the anode diffusion region and an edge of the anode diffusion region adjacent to the edge termination region;
   an insulator film interposed between the electrode area and the edge area of the anode diffusion region; and
   a ring-shaped first metal film disposed on the insulator film and located outside the anode diffusion region, in contact with the surface of the edge area of the anode diffusion region via a ring-shaped opening formed through the insulator film, the first metal film including an outer edge positioned outside the edge of the anode diffusion region adjacent to the edge termination region, wherein an edge of the anode electrode adjacent to the edge termination region is positioned on the insulator film and over the edge area of the anode diffusion region.

2. The semiconductor device according to claim 1, wherein the electrode area further includes a bridging electrode portion having an area smaller than an area of the insulator film disposed beneath the bridging electrode portion.

3. The semiconductor device according to claim 1, wherein the electrode area extends beyond the edge of the anode diffusion region adjacent to the edge termination region.

4. The semiconductor device according to claim 1, further comprising a ring-shaped second metal film formed above the edge area of the anode diffusion region, between the first metal film and the outer edge of the anode electrode, electrically isolated from the anode electrode, the insulator film interposed between the second metal film and the edge area of the anode diffusion region.

5. The semiconductor device according to claim 1, further comprising a ring-shaped third metal film formed between the first metal film and the anode electrode.

6. The semiconductor device according to claim 5, wherein the ring-shaped third metal film is disposed on the insulator film, outside the anode diffusion region, the third metal film being in contact with the surface of the edge area of the anode diffusion region via a ring-shaped opening formed through the insulator film, an edge of the anode electrode being adjacent to the edge termination region is positioned on the insulator film and over the edge area of the anode diffusion region.

7. A semiconductor device comprising:
a semiconductor substrate of a first conductivity type, having a first major surface;
an anode diffusion region of a second conductivity type, formed in a surface portion on a side of the semiconductor substrate that includes the first major surface, the anode diffusion region having an edge area;
an edge termination region surrounding the anode diffusion region;
an anode electrode disposed on the anode diffusion region, the anode electrode including an ohmic contact area in ohmic contact with the anode diffusion region and an electrode area, the electrode area located directly above the edge area of the anode diffusion region and between an edge of the ohmic contact area adjacent to the edge area of the anode diffusion region and an edge of the anode diffusion region adjacent to the edge termination region; and
an insulator film interposed between the electrode area and the edge area of the anode diffusion region;
wherein a length of the electrode area in a direction perpendicular to the edge of the anode diffusion region adjacent to the edge termination region is less than half of the length of the insulator film in the direction perpendicular to the edge of the anode diffusion region adjacent to the edge termination region.

8. A semiconductor device comprising:
a semiconductor substrate of a first conductivity type, having a first major surface;
an anode diffusion region of a second conductivity type formed in a surface portion on a side of the semiconductor substrate including the first major surface, the anode diffusion region having an edge area;
an edge termination region surrounding the anode diffusion region;
an anode electrode disposed on the anode diffusion region, the anode electrode including an ohmic contact area in ohmic contact with the anode diffusion region and an electrode area, the electrode area located directly above a surface of the edge area of the anode diffusion region, between an edge of the ohmic contact area adjacent to the edge area of the anode diffusion region and an edge of the anode diffusion region adjacent to the edge termination region;
an insulator film interposed between the electrode area of the anode electrode and the edge area of the anode diffusion region; and
a ring-shaped metal film disposed on the insulator film in the edge area of the anode diffusion region, the metal film being in contact with the edge area of the anode diffusion region via an opening formed through the insulator film, a length of the opening being greater than or equal to half of the length of the edge area of the anode diffusion region in a direction perpendicular to the edge of the anode diffusion region adjacent to the edge termination region.

9. The semiconductor device according to claim 8, further comprising a lifetime control region including a bottom portion of the edge area of the anode diffusion region and a portion of the semiconductor substrate adjacent to the bottom portion of the edge area, the lifetime control region extending across a pn-junction between the semiconductor substrate and the anode diffusion region, wherein a minority carrier lifetime in the lifetime control region is shortened locally.

10. The semiconductor device according to claim 8, further comprising an additional ring-shaped metal film extending onto the insulator film, the insulator film extending beyond the edge area of the anode diffusion region.

11. The semiconductor device according to claim 1, wherein
a width $W_{FFM}$ of the ring shape of the fourth first metal film is not smaller than 10 μm, and
a ratio $W_{FFM}$ to a shortest distance $W_{ACT}$ from among distances of lines that extend perpendicularly from the geometrical barycenter of the first major surface side of the anode diffusion region up to respective sides of a polygon defined by an outer edge of the anode diffusion region, is $W_{FFM}/W_{ACT} \leq 0.3$.

12. The semiconductor device according to claim 11, wherein a width $W_{CNT}$ of the opening formed in the insulator film of the anode diffusion region edge area satisfies $W_{CNT} \geq W_R$, $W_R$ being a value resulting from subtracting width $W_{CNT}$ of the opening from width $W_{FFM}$ of the ring shape of the first metal film.

* * * * *